(12) United States Patent
Parekh

(10) Patent No.: US 7,378,704 B2
(45) Date of Patent: May 27, 2008

(54) SEMICONDUCTOR CONSTRUCTIONS, AND METHODS OF FORMING SEMICONDUCTOR CONSTRUCTIONS

(75) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 253 days.

(21) Appl. No.: 11/377,094

(22) Filed: Mar. 16, 2006

(65) Prior Publication Data
US 2007/0218616 A1    Sep. 20, 2007

(51) Int. Cl.
*H01L 27/108* (2006.01)
(52) U.S. Cl. ............... 257/296; 438/238; 257/E27.048; 257/E21.646
(58) Field of Classification Search ................ 438/142, 438/197, 199, 201, 207, 210, 211, 218, 219, 438/221, 222, 238, 239, 270, 424–426; 257/213, 257/274, 288, 296, 298, 300, E21.048, E21.645, 257/E21.646
See application file for complete search history.

(56) References Cited

U.S. PATENT DOCUMENTS 4,849,370 A * 7/1989 Spratt et al. ................ 438/409

6,846,720 B2 * 1/2005 Balasubramanian et al. .......................... 438/424

OTHER PUBLICATIONS

Yeo, K. et al., "80 nm 512M DRAM with Enhanced Data Retention Time Using Partially-Insulated Cell Array Transistor (PiCAT)", 2004 Sympos. on VLSI Tech. , Digest of Technical Papers, IEEE 2004, pp. 30-31.

* cited by examiner

*Primary Examiner*—Brook Kebede
(74) *Attorney, Agent, or Firm*—Wells St. John P.S.

(57) ABSTRACT

The invention includes methods of incorporating partial SOI into transistor structures. In particular aspects, dielectric material is provided over semiconductor material, and patterned into at least two segments separated by a gap. Additional semiconductor material is then grown over the dielectric material and within the gap. Subsequently, a transistor is formed to comprise source/drain regions within the additional semiconductor material, and to comprise a channel between the source/drain regions. At least one of the source/drain regions is primarily directly over a segment of the dielectric material, and the channel is not primarily directly over any segment of the dielectric material. The invention also includes constructions comprising partial SOI corresponding to segments of dielectric material, and transistors having at least one source/drain region primarily directly over a segment of dielectric material, and a channel that is not primarily directly over any segment of the dielectric material.

39 Claims, 15 Drawing Sheets

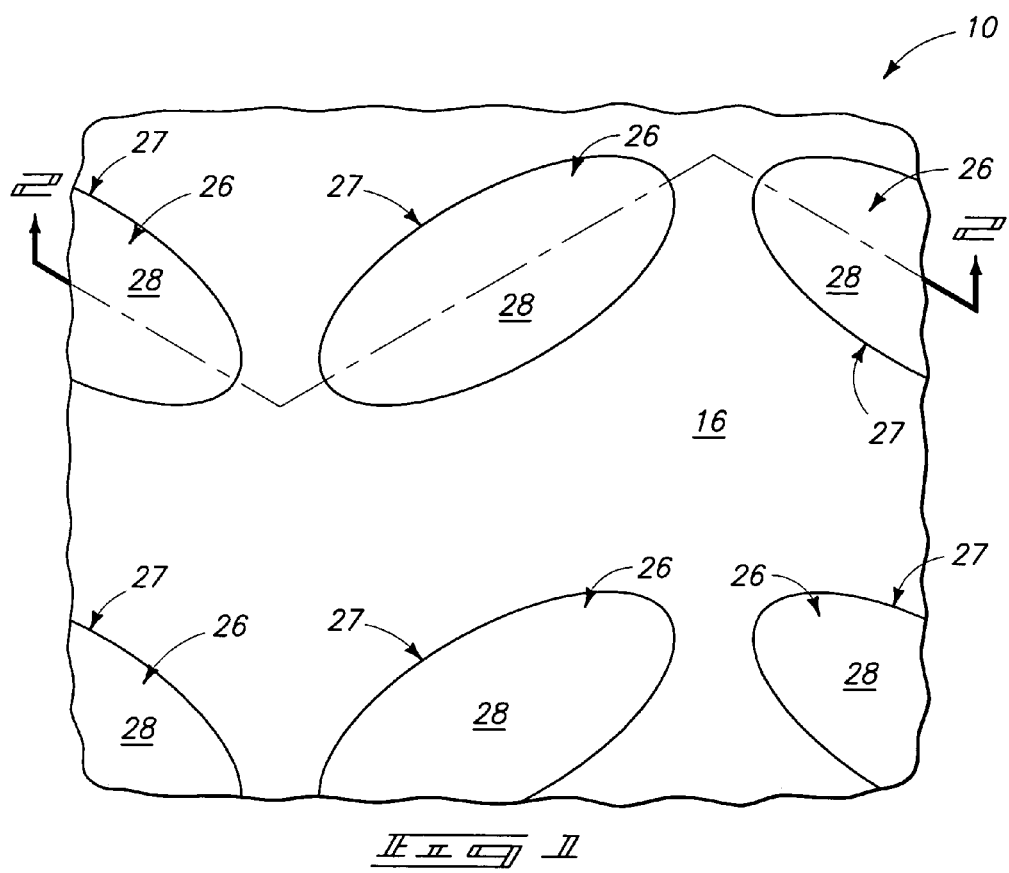
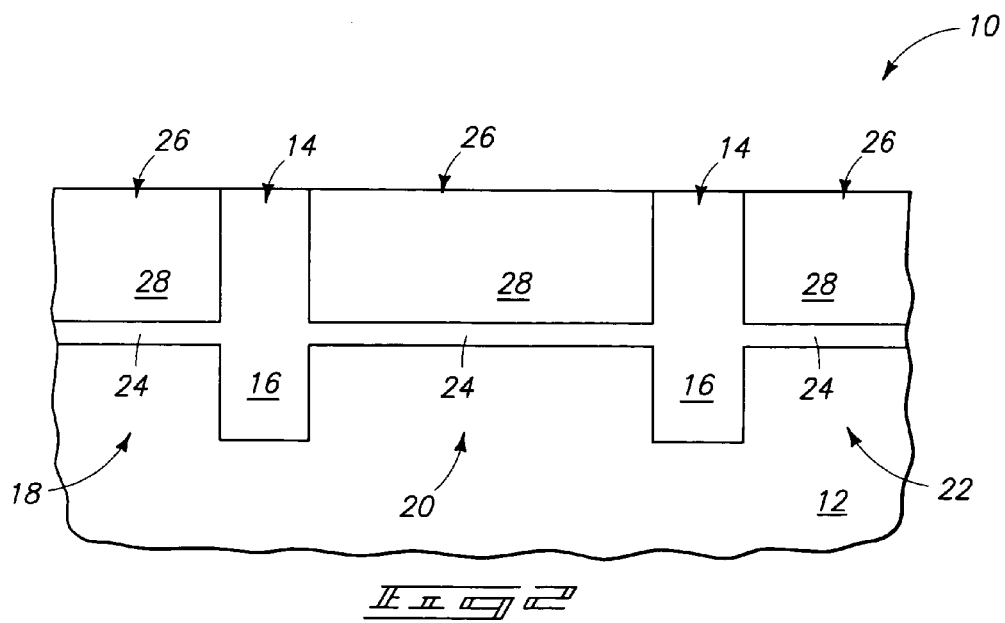

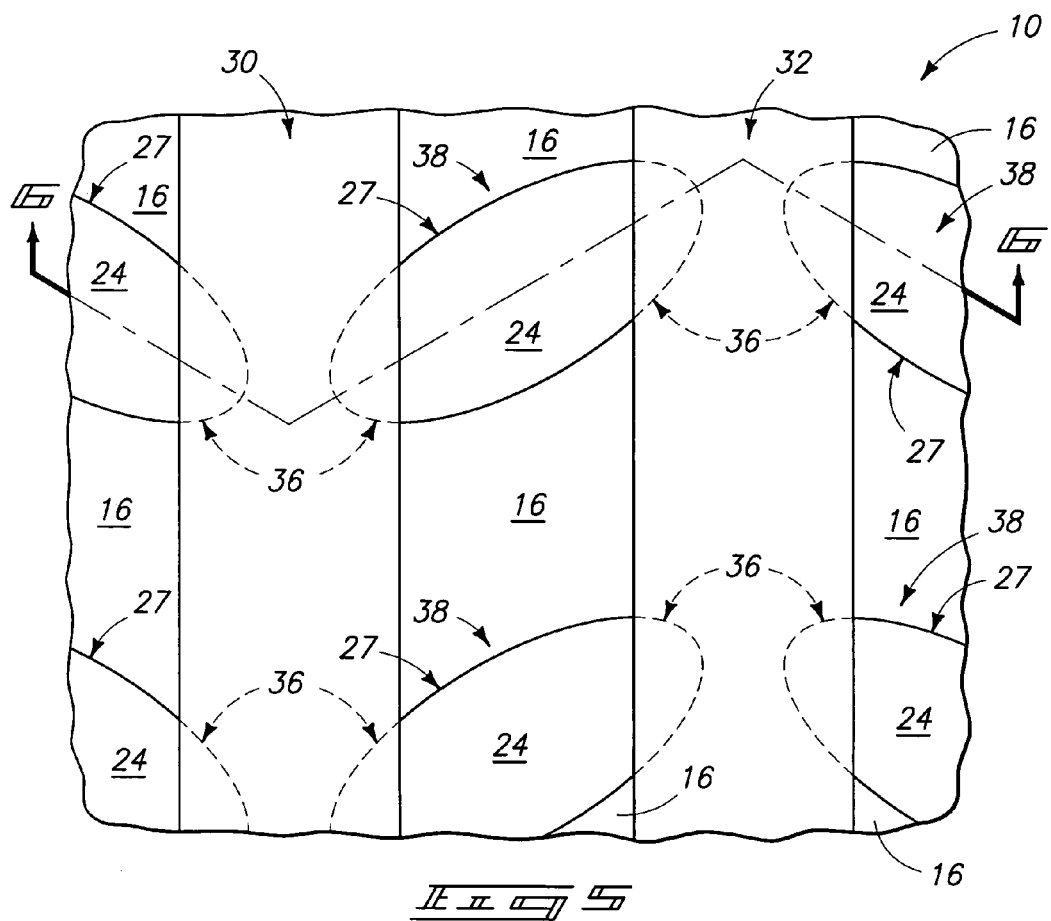
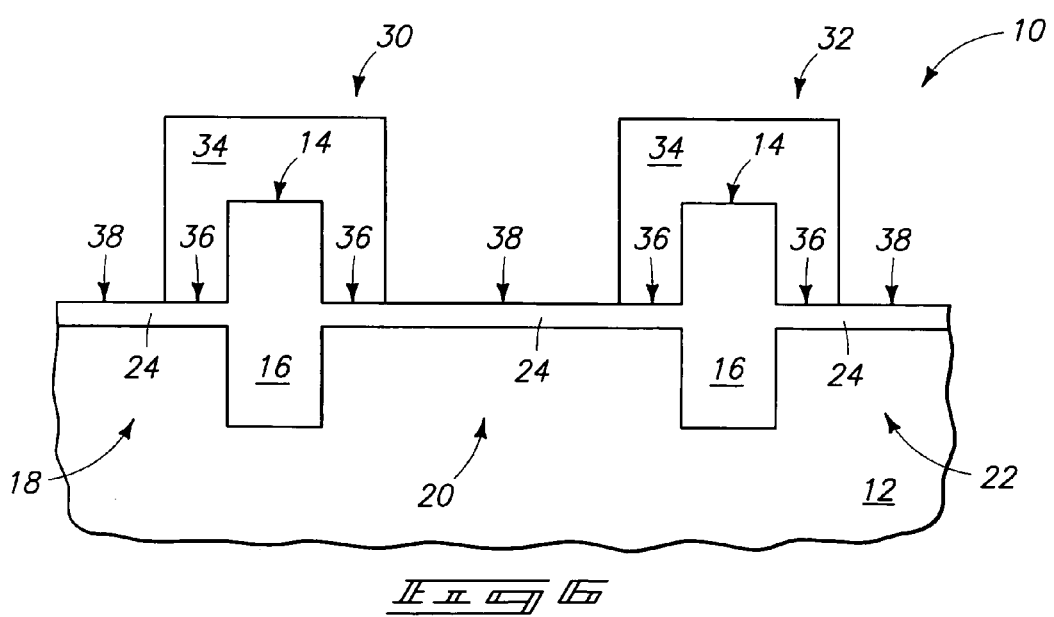

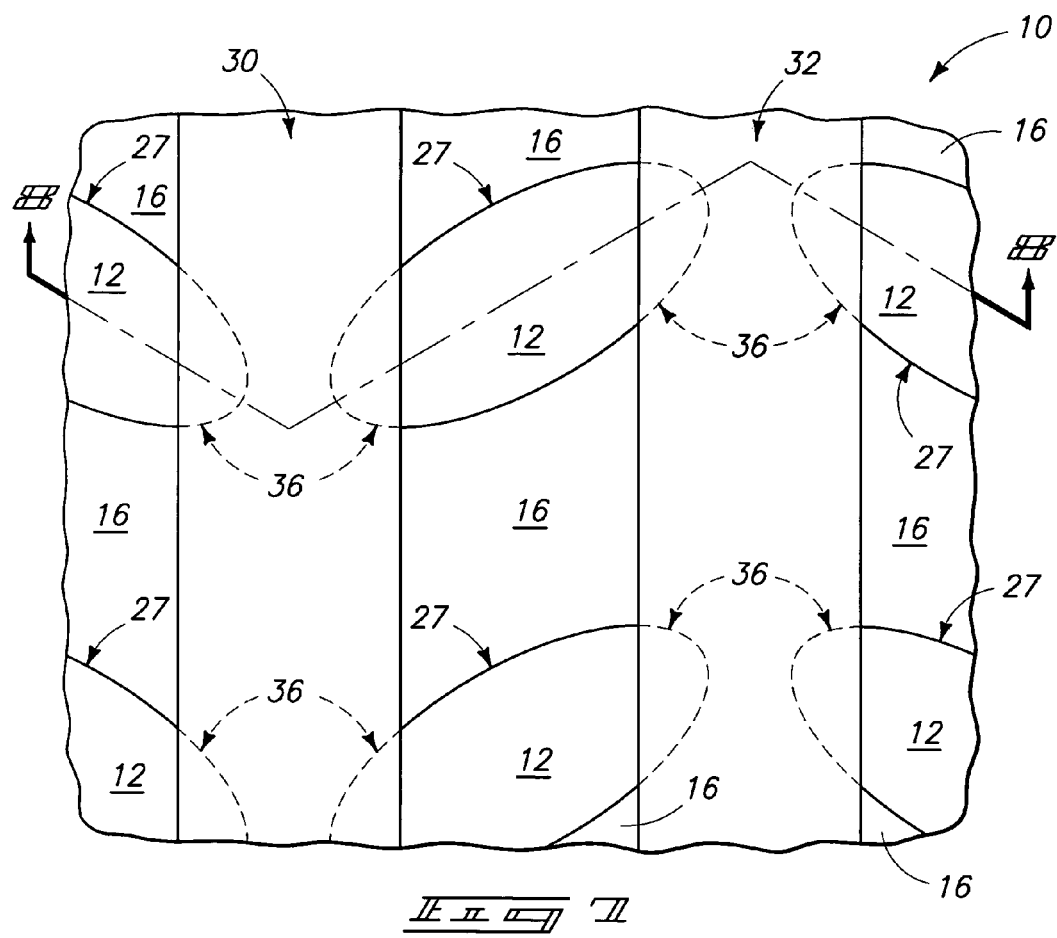
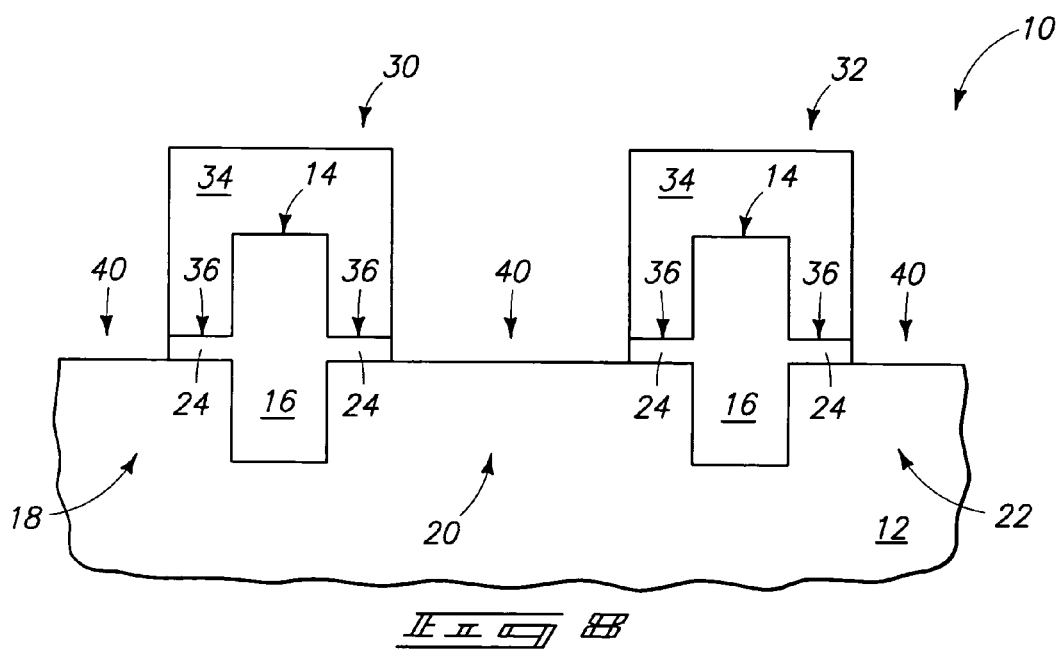

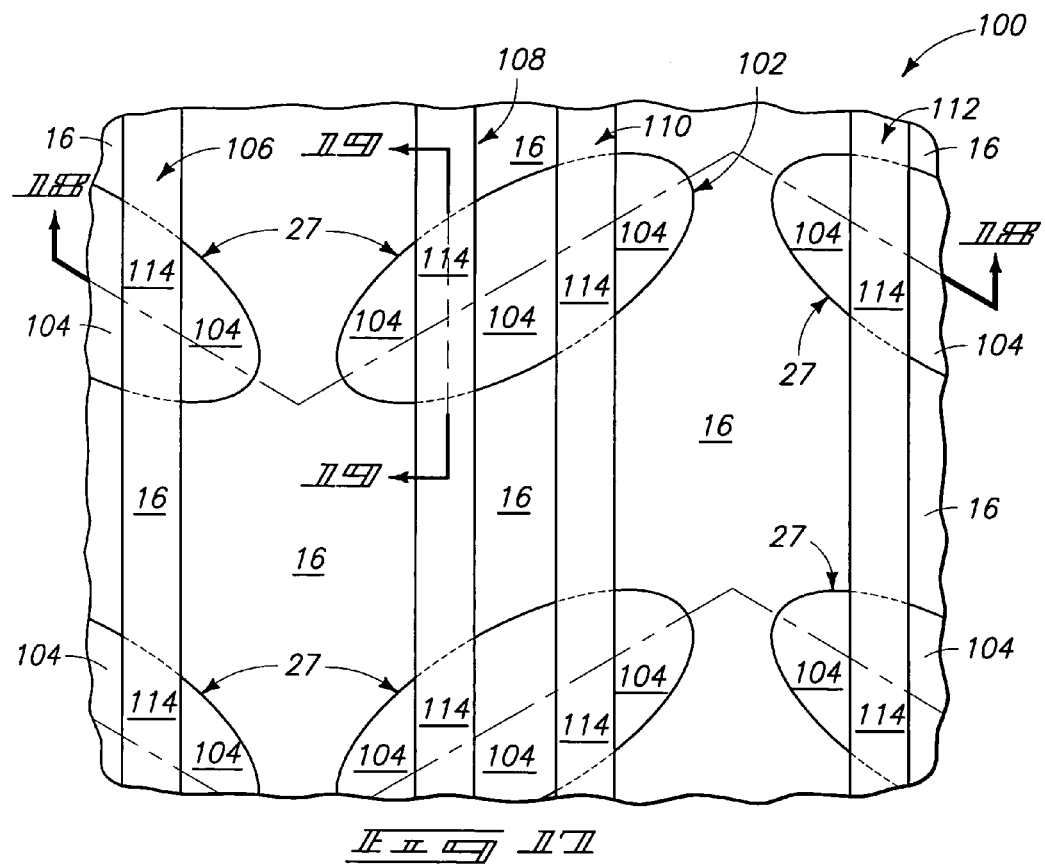
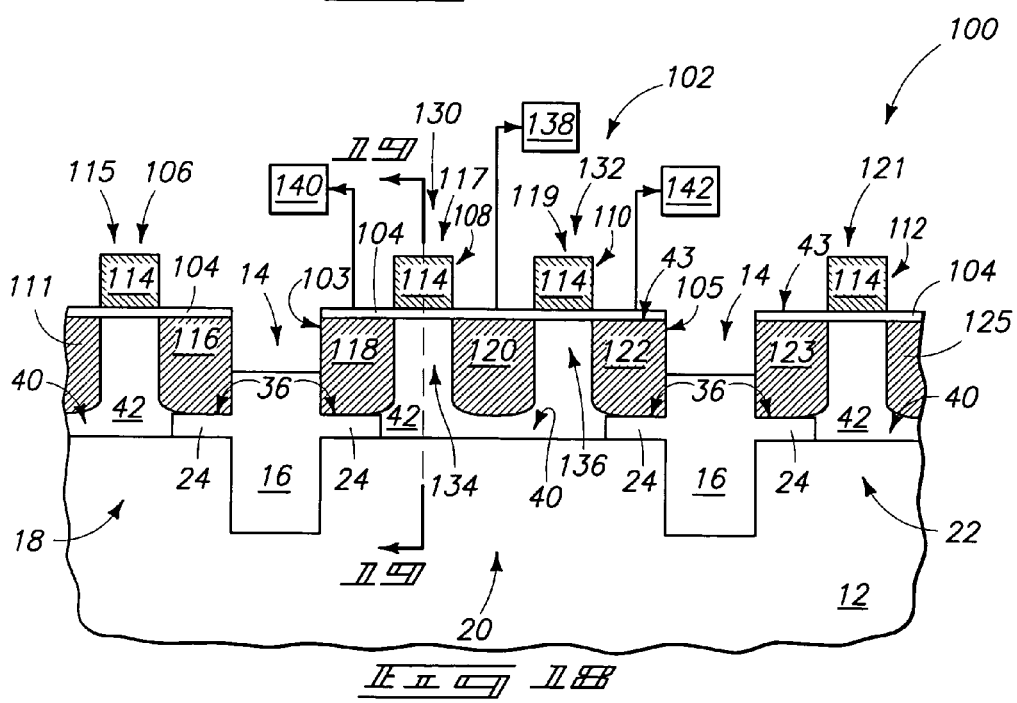

US 7,378,704 B2

SEMICONDUCTOR CONSTRUCTIONS, AND METHODS OF FORMING SEMICONDUCTOR CONSTRUCTIONS

TECHNICAL FIELD

The invention pertains to semiconductor constructions, and to methods of forming semiconductor constructions. In particular aspects, the invention pertains to methods of incorporating partial silicon-on-insulator (SOI) into semiconductor constructions, and to semiconductor constructions comprising partial SOI.

BACKGROUND OF THE INVENTION

Dynamic random access memory (DRAM) is utilized in numerous electronic systems. A continuing goal is to increase the level of integration, with a corresponding goal to decrease the size of memory devices. As the design rule of memory devices decreases, channel doping within transistors associated with memory increases to alleviate short channel effects. However, the increased channel doping can cause increased leakage at junctions, which can render it increasingly difficult to obtain sufficient data retention time within the memory devices.

One approach being considered for reducing leakage at junctions is to utilize partially-insulated transistors, and more specifically to utilize partial SOI to alleviate leakage at source/drain junctions. It would be desirable to develop economical methods for incorporating such approach into the fabrication of memory devices. Accordingly, it would be desirable to develop new methods for incorporating partial SOI into memory constructions. It would also be desirable to develop improved memory constructions containing partial SOI.

Although the invention was motivated, at least in part, by a desire to improve memory constructions (such as, for example, DRAM constructions), it is to be understood that the invention described herein can have additional applications besides utilization for memory constructions, and accordingly that the invention is to be limited only by the claims that follow.

SUMMARY OF THE INVENTION

In one aspect, the invention includes a method of forming a semiconductor construction. A semiconductor substrate is provided. The substrate has a first semiconductor material, and an isolation region extending into the first-semiconductor material. A portion of the first semiconductor material is laterally surrounded by the isolation region, and a dielectric material is over such portion. The dielectric material is patterned into at least two segments separated by a gap. A second semiconductor material is epitaxially grown through the gap and to over the segments of the dielectric material. At least one transistor is formed to have a source/drain region within the second semiconductor material and primarily directly over one of the segments of the dielectric material, and to have a channel region that is not primarily directly over any of the segments of the dielectric material.

In one aspect, the invention includes another method of forming a semiconductor construction. A semiconductor substrate provided which has mesas of first semiconductor material laterally surrounded by isolation regions, and which has dielectric material over the mesas. Patterned protective blocks are formed over portions of the dielectric material. At least some of the protective blocks extend across portions of two separate mesas. A pattern is transferred from the patterned protective blocks to the dielectric material to pattern the dielectric material into spaced segments over the mesas, and to form gaps over the mesas and between the spaced segments. Second semiconductor material is epitaxially grown through the gaps and to over the segments of dielectric material. Transistors are formed which have source/drain regions within the second semiconductor material and primarily directly over the segments of the dielectric material, and which have channel regions that are not primarily directly over any of the segments of the dielectric material.

In one aspect, the invention includes yet another method of forming a semiconductor construction. A semiconductor substrate is provided which has a bulk semiconductor material and an isolation region extending into the bulk semiconductor material. A mesa of the bulk semiconductor material is laterally surrounded by the isolation region. A mask is over the mesa, with such mask comprising silicon nitride over dielectric material. The silicon nitride of the mask is removed, and protective blocking material is formed that extends across at least some of the isolation region and partially across the mesa. The protective blocking material covers portions of the dielectric material of the mask, and leaves at least one portion of the dielectric material exposed. The at least one exposed portion of the dielectric material is removed to expose semiconductor material of the mesa. The blocking material is removed to leave segments of the dielectric material over portions of the mesa adjacent the exposed semiconductor material of the mesa. A layer of semiconductor material is epitaxially grown from the exposed semiconductor material of the mesa. The epitaxially grown semiconductor material extends over the segments of dielectric material. At least one transistor is formed having a source/drain region within the layer of semiconductor material and primarily directly over a segment of the dielectric material, and having a channel region that is not primarily directly over any of the segments of the dielectric material.

In one aspect, the invention includes a semiconductor construction. The construction comprises a semiconductor material, and an isolation region extending into the semiconductor material. The isolation region laterally surrounds a region of the semiconductor material. Such region of the semiconductor material has an upper surface above the isolation region, and has, in cross-sectional view, a pair of opposing sidewall edges extending from the upper surface to down along the isolation region. The construction further comprises a pair of spaced segments of dielectric material extending into the region of semiconductor material from laterally opposing sides of the region. The segments are spaced from one another by at least one portion of the semiconductor material. Additionally, the construction includes a wordline extending across the isolation region and across the region of semiconductor material. Such wordline extends upwardly along the opposing sidewall edges of the region of the semiconductor material. Further, the construction includes a gate dielectric between the wordline and the region of semiconductor material, with the gate dielectric extending over the upper surface and along the opposing sidewall edges of the region of semiconductor material. The construction also includes a transistor gate comprising the wordline over the region of semiconductor material, a first source/drain region on one side of the transistor gate, a second source/drain region on an opposing side of the transistor gate from the first source/drain region, and a channel region between the first and second source/drain regions. The first source/drain region is primarily directly over one of the segments of the dielectric material, and the channel region is not primarily directly over any segment of the dielectric material.

BRIEF DESCRIPTION OF THE DRAWINGS

Preferred embodiments of the invention are described below with reference to the following accompanying drawings.

FIGS. 1 and 2 are a diagrammatic fragmentary top view and cross-sectional side view, respectively, of a semiconductor construction at a preliminary processing stage in accordance with an exemplary aspect of the present invention. The cross-section of FIG. 2 is along the line 2-2 of FIG. 1.

FIGS. 5 and 6 are views of the fragments of FIGS. 1 and 2, respectively, at a processing stage subsequent to that of FIGS. 3 and 4, in accordance with an exemplary aspect of the present invention. The cross-section of FIG. 6 is along the line 6-6 of FIG. 5.

FIGS. 7 and 8 are views of the fragments of FIGS. 1 and 2, respectively, at a processing stage subsequent to that of FIGS. 5 and 6, in accordance with an exemplary aspect of the present invention. The cross-section of FIG. 8 is along the line 8-8 of FIG. 7.

FIGS. 17 and 18 are views of the fragments of FIGS. 1 and 2, respectively, at a processing stage subsequent to that of FIGS. 13 and 14, in accordance with another exemplary aspect of the present invention. The cross-section of FIG. 18 is along the line 18-18 of FIG. 17.

DETAILED DESCRIPTION OF THE PREFERRED EMBODIMENTS

Figure 3:
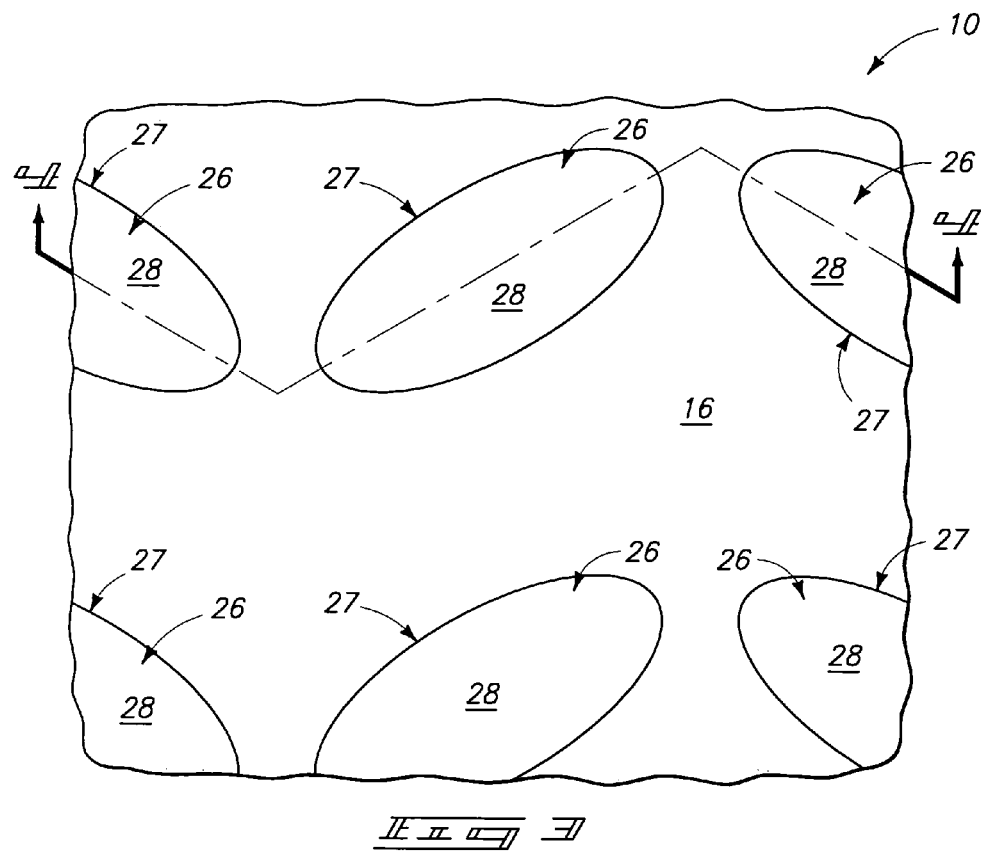
FIGS. 3 and 4 are views of the fragments of FIGS. 1 and 2, respectively, at a processing stage subsequent to that of FIGS. 1 and 2, in accordance with an exemplary aspect of the present invention. The cross-section of FIG. 4 is along the line 4-4 of FIG. 3.

This disclosure of the invention is submitted in furtherance of the constitutional purposes of the U.S. Patent Laws "to promote the progress of science and useful arts" (Article 1, Section 8).

The invention includes methods for incorporating pseudo SOI into semiconductor constructions. In particular aspects, the invention includes an economical method for forming pseudo SOI regions under memory storage elements for reduced junction leakage, while maintaining a body tie for an access transistor.

Exemplary aspects of the invention are described below with reference to FIGS. 1-29. FIGS. 1-16 illustrate a first embodiment aspect of the invention, FIGS. 17 and 18 illustrate a second embodiment aspect the invention, FIGS. 19-25 illustrate a third embodiment aspect of the invention, and FIGS. 26-29 illustrate applications for the invention in electronic systems.

Referring to FIGS. 1 and 2, such illustrate a top view and cross-sectional side view, respectively, of a semiconductor construction 10 at a preliminary processing stage in accordance with an aspect of the present invention.

The construction includes a bulk semiconductor material 12 and isolation regions 14 extending into the bulk material. The bulk semiconductor material can be any suitable material. Semiconductor material 12 can be referred to as a first semiconductor material in some aspects, and/or can be referred to as a substrate. The substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The isolation regions are trenched isolation regions, and specifically comprise insulative material 16 extending into trenches within the semiconductor material 12. Such insulative material can, for example, comprise, consist essentially of, or consist of silicon dioxide. The trenched isolation regions laterally surround portions of the bulk semiconductor material 12. Exemplary laterally surrounded portions of substrate 12 are designated by labels 18, 20 and 22 in FIG.

2, and in some aspects such laterally surrounded portions can be referred to as mesas or islands.

In the shown aspect of the invention, all of the isolation material is connected together to form a continuous mass of isolation material across the substrate. In such aspects, the isolation material can be considered to form a single isolation region, and the mesas of semiconductor material can be considered to be segments within the single isolation region. However, it would also be common to refer to the isolation material as being a plurality of isolation regions that are joined to one another, with individual isolation regions being defined by the positions of the mesas, and being understood to be the isolation material directly associated with a particular mesa. Thus, the view of FIG. 1 could be understood to show locations of six spaced mesas (which would be below the visible material 28), and locations of six isolation regions that join to one another. Either understanding of the isolation region material (i.e., either the description of the material as being a single large isolation region, or as being a plurality of separate joined isolation regions) can be utilized in this description and the claims that follow.

Dielectric material 24 extends between isolation regions 14. In the shown aspect, the dielectric material 24 comprises the same composition as insulative material 16, and accordingly is shown merging with the insulative material of the isolation regions. Dielectric material 24 can thus, like insulative material 16, comprise, consist essentially of, consist of silicon dioxide. It is to be understood, however, that dielectric material 24 can comprise compositions other than that utilized in the isolation regions in some aspects of the invention. The dielectric material 24 is over the portions of semiconductor material 12 laterally surrounded by isolation regions 14 (in other words, is over the mesas 18, 20 and 22 of FIG. 2).

Patterned blocks 26 are over the dielectric material 24. The patterned blocks are of a composition 28 which can, for example, comprise, consist essentially of, or consist of silicon nitride. In some aspects, blocks 26 and dielectric material 24 can together be considered to define a patterned mask, and the isolation regions can be considered to be formed within openings extending through such patterned mask. In typical processing, dielectric material 24 is provided across substrate 12 as a pad oxide, and silicon nitride 28 is provided over the dielectric material. The pad oxide protects substrate 12 from stresses that would occur if the silicon nitride were formed directly against monocrystalline silicon of the substrate. The silicon nitride and pad oxide are patterned to form the blocks 26, and subsequently trenches are etched into substrate 12 in gaps between the blocks. The trenches are then filled with suitable insulative material to form the isolation regions 14.

The areas defined by patterned blocks 26 can be referred to as active area locations 27 in some aspects of the invention, in that such locations will ultimately be locations of active areas of transistor devices. The shown pattern of active area locations in the top view of FIG. 1 is an exemplary pattern. Persons of ordinary skill in the art will recognize that there are numerous other patterns, and that the present invention can be applied to the various other patterns.

Figure 4:
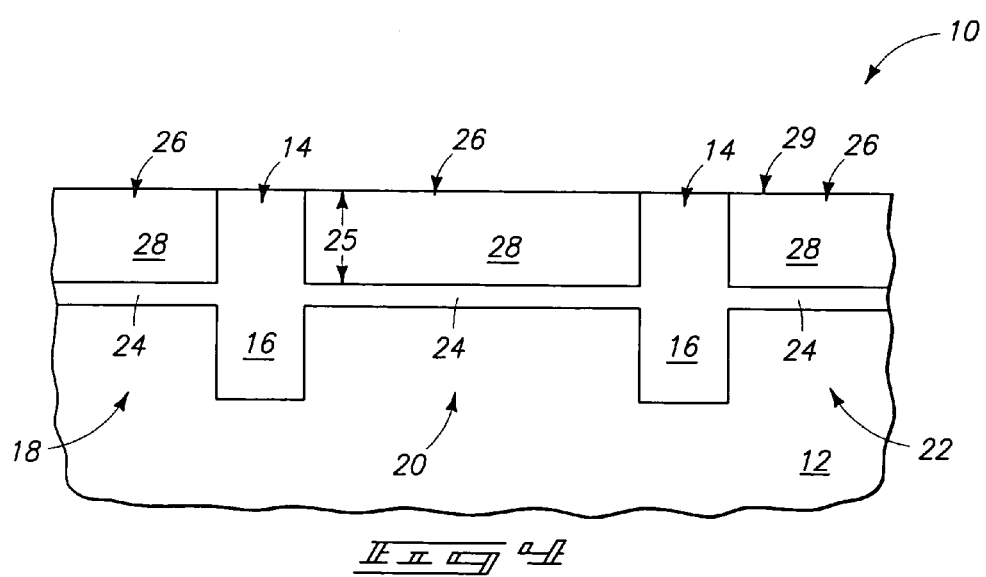

Although the structure 10 of FIG. 2 is shown having a planarized upper surface extending across blocks 26 and isolation regions 14, there typically will be some insulative material 16 extending across blocks 26 after the initial deposition of the insulative material within the trenches. Accordingly, planarization is conducted to form a suitable planarized upper surface extending across blocks 26 and the isolation regions 14. The planarization can be accomplished by, for example, chemical-mechanical polishing (CMP). FIGS. 3 and 4 show construction 10 after suitable planarization is conducted to form a planarized upper surface 29 extending across blocks 26 and isolation regions 14. In some aspects, the planarization can be considered to reduce heights of insulative material 14 and blocks 26 from first and second heights, respectively, to a third height that is below the first and second heights. The planarization can reduce the thickness of material 28 (such thickness is designated with the label 25 in FIG. 4) to any desired thickness, such as, for example, to a thickness of from about 300 angstroms to about 5000 angstroms.

Referring next to FIGS. 5 and 6, blocks 26 (FIGS. 3 and 4) are removed, and patterned blocks 30 and 32 of protective blocking material 34 are formed to extend partially across the mesas 18, 20 and 22 of semiconductor material 12. The patterned blocks 30 and 32 cover portions 36 of the dielectric material 24 (the covered portions are shown in dashed-line view in the top view of FIG. 5). The patterned blocks of protective blocking material also leave portions 38 of the dielectric material 24 uncovered (in other words, exposed).

In the shown aspect of the invention, the patterned blocks 30 and 32 extend across some of the isolation region 14.

Patterned blocks 30 and 32 preferably comprise a material to which the dielectric material 24 can be selectively removed, and which can also be selectively removed relative to such dielectric material. If the dielectric material 24 consists essentially of, or consist of silicon dioxide, the patterned blocks 30 and 32 can, for example, comprise, consist essentially of, or consist of photoresist. The photoresist can be patterned into the blocks 30 and 32 utilizing photolithographic procedures.

Referring to FIGS. 7 and 8, the exposed portions 38 of dielectric material 24 (FIGS. 5 and 6) are removed to leave the covered segments 36 of the dielectric material. Such can be considered to pattern the dielectric material 24 into segments 36 separated by gaps 40. In the shown aspect of the invention, two segments extend from laterally opposing sides over a mesa in the cross-sectional view of FIG. 8 (for instance, two segments extend from laterally opposing sides over mesa 20), and the gaps 40 are centrally located over the mesas.

Figure 9:
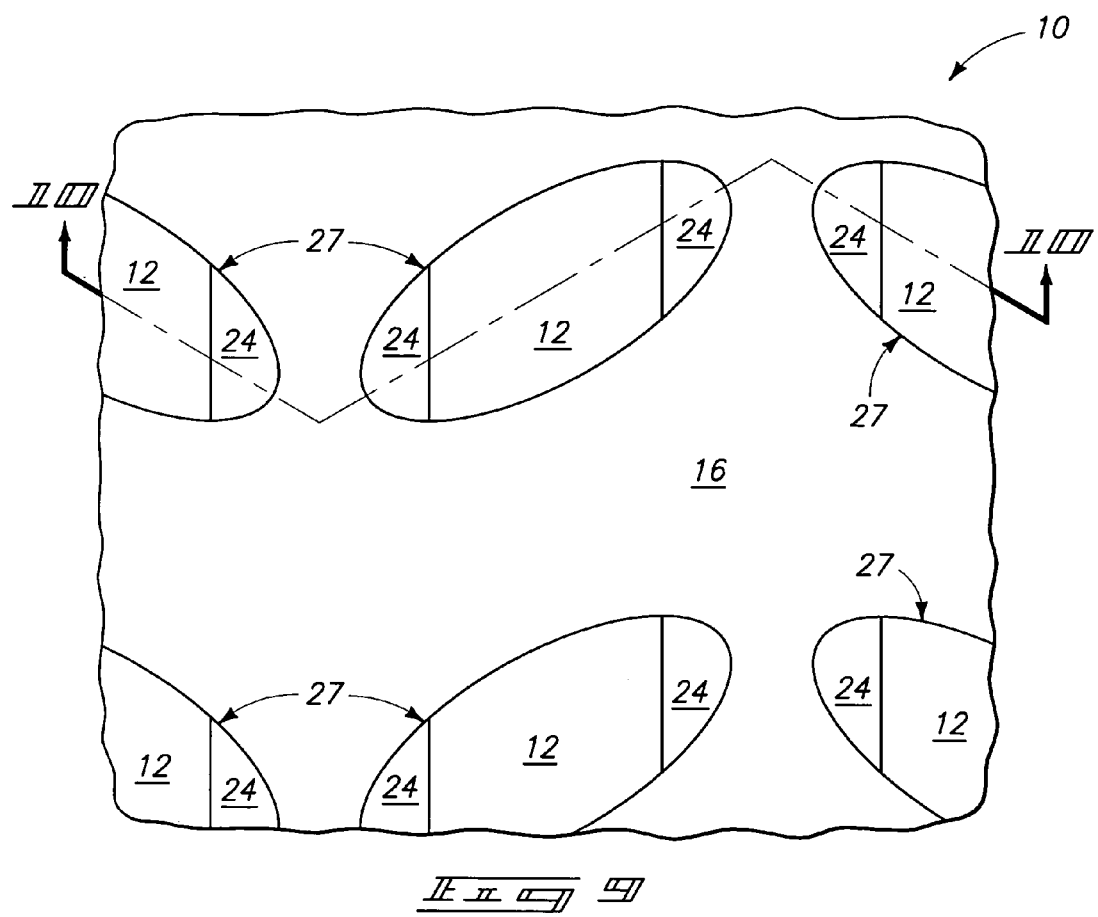
FIGS. 9 and 10 are views of the fragments of FIGS. 1 and 2, respectively, at a processing stage subsequent to that of FIGS. 7 and 8, in accordance with an exemplary aspect of the present invention. The cross-section of FIG. 10 is along the line 10-10 of FIG. 9.
Figure 10:
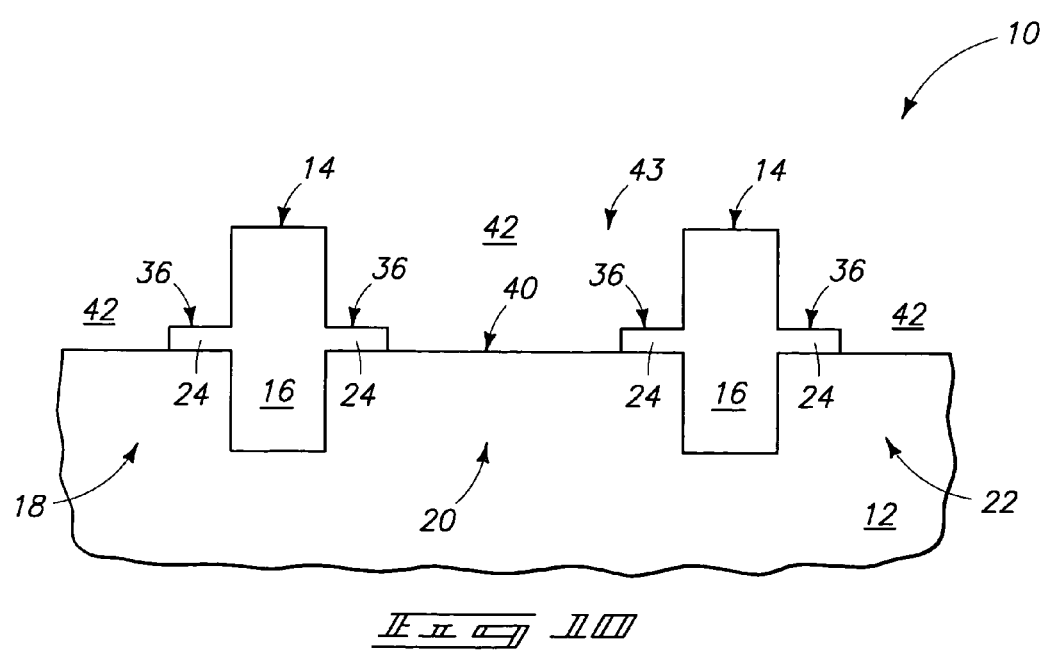

Referring to FIGS. 9 and 10, the blocks 30 and 32 of protective blocking material 34 (FIGS. 7 and 8) are removed. After removal of such blocks, construction 10 has an upper surface containing segments of dielectric material 36 over portions of the mesas 18, 20 and 22, and exposed semiconductor material within the gaps 40 that are also over the mesas 18, 20 and 22.

Figure 11:
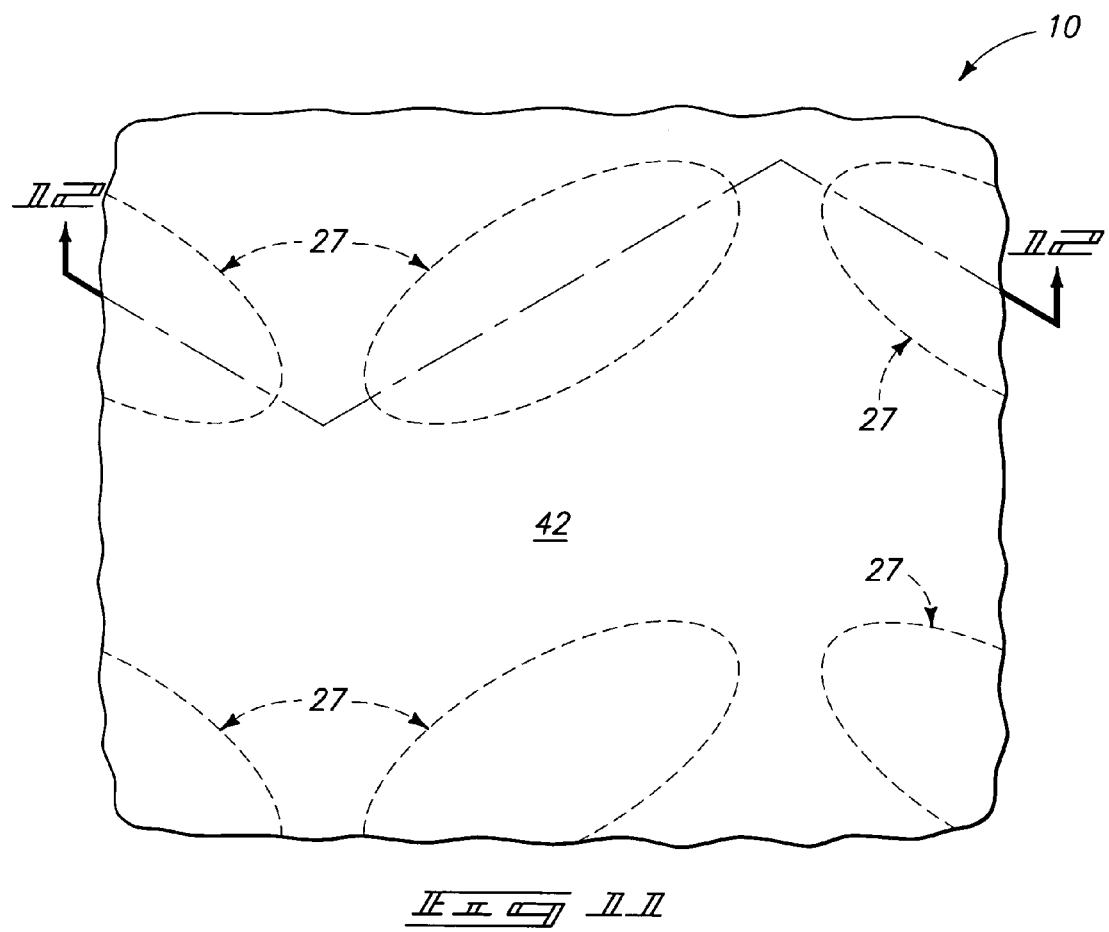
FIGS. 11 and 12 are views of the fragments of FIGS. 1 and 2, respectively, at a processing stage subsequent to that of FIGS. 9 and 10, in accordance with an exemplary aspect of the present invention. The cross-section of FIG. 12 is along the line 12-12 of FIG. 11.
Figure 12:
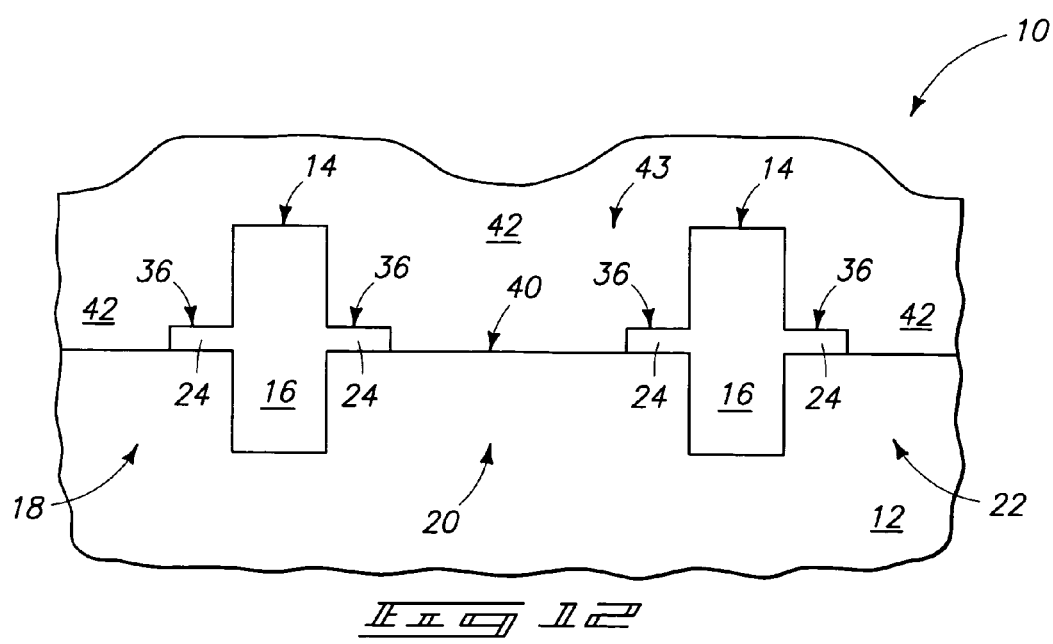

Referring to FIGS. 11 and 12, a second semiconductor material 42 is epitaxially grown from the semiconductor material 12 exposed within gaps 40. The second semiconductor material 42 can be the same as the first semiconductor material 12, or different. In particular aspects, semiconductor materials 12 and 42 both comprise, consist essentially of, or consist of monocrystalline silicon. In other aspects, one or both of the semiconductor materials 12 and 42 can comprise another semiconductor material in addition to, or alternatively to, silicon. For instance, and or both of the second materials 12 and 42 can comprise germanium.

In the shown aspect of the invention, the epitaxially grown semiconductor material 42 extends over the insulative material 16 of isolation regions 14, and also over the segments 36 of dielectric material 24.

The active area locations 27 are shown in dashed-line in the top view of FIG. 11 to indicate that such active area locations are beneath semiconductor material 42.

Figure 13:
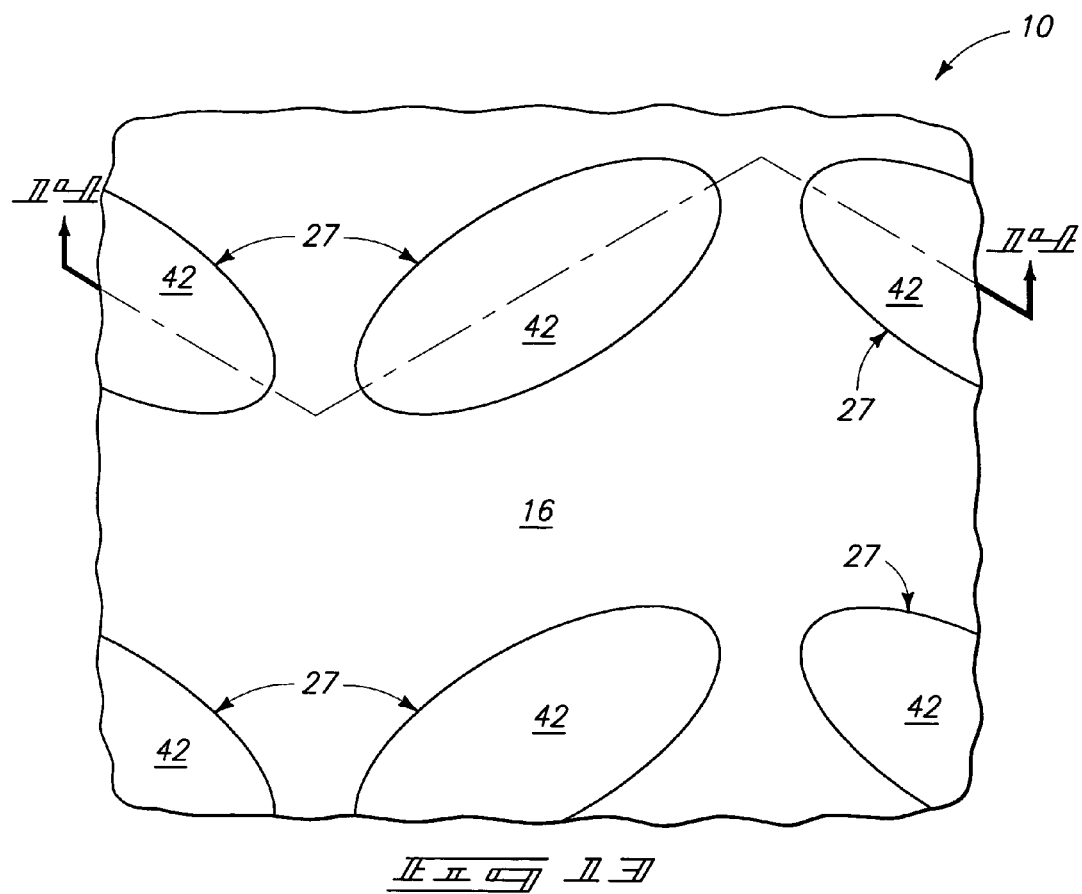
FIGS. 13 and 14 are views of the fragments of FIGS. 1 and 2, respectively, at a processing stage subsequent to that of FIGS. 11 and 12, in accordance with an exemplary aspect of the present invention. The cross-section of FIG. 14 is along the line 14-14 of FIG. 13.
Figure 14:
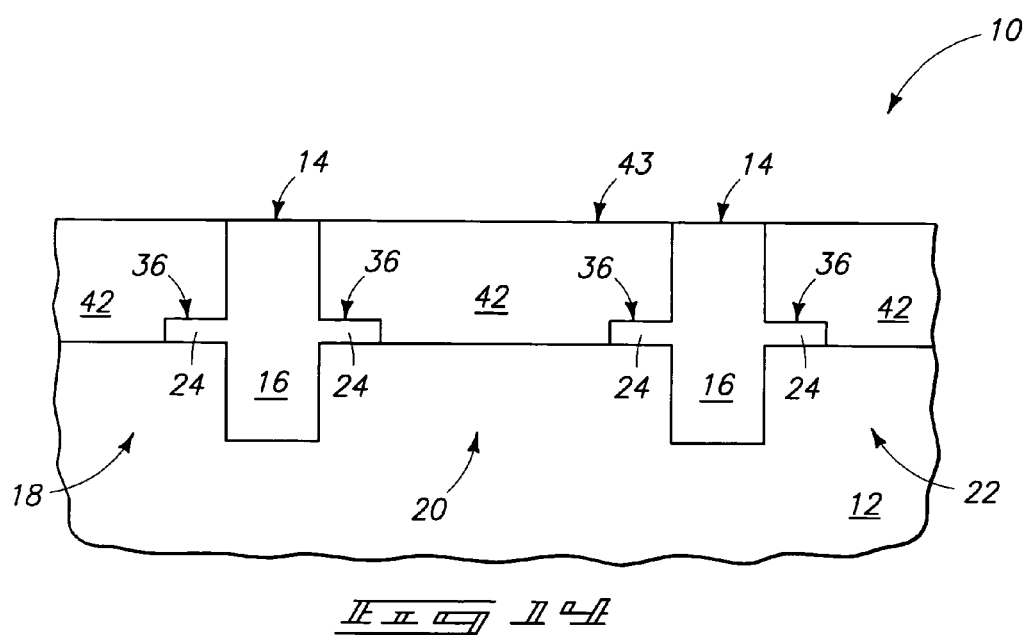

Referring to FIGS. 13 and 14, construction 10 is subjected to planarization to form a planarized upper surface 43 extending across material 42, and across the insulative material 16 of isolation regions 14. Such planarization can be accomplished by, for example, CMP. The planarization can stop on uppermost surfaces of insulative material 16, or may remove some of the insulative material 16. The planarization forms islands (or mesas) of second semiconductor material 42 surrounded by insulative material 16, as shown in the top view of FIG. 13. Such islands correspond to the active area locations 27 originally defined by the masking material 28 of FIG. 1.

Figure 15:
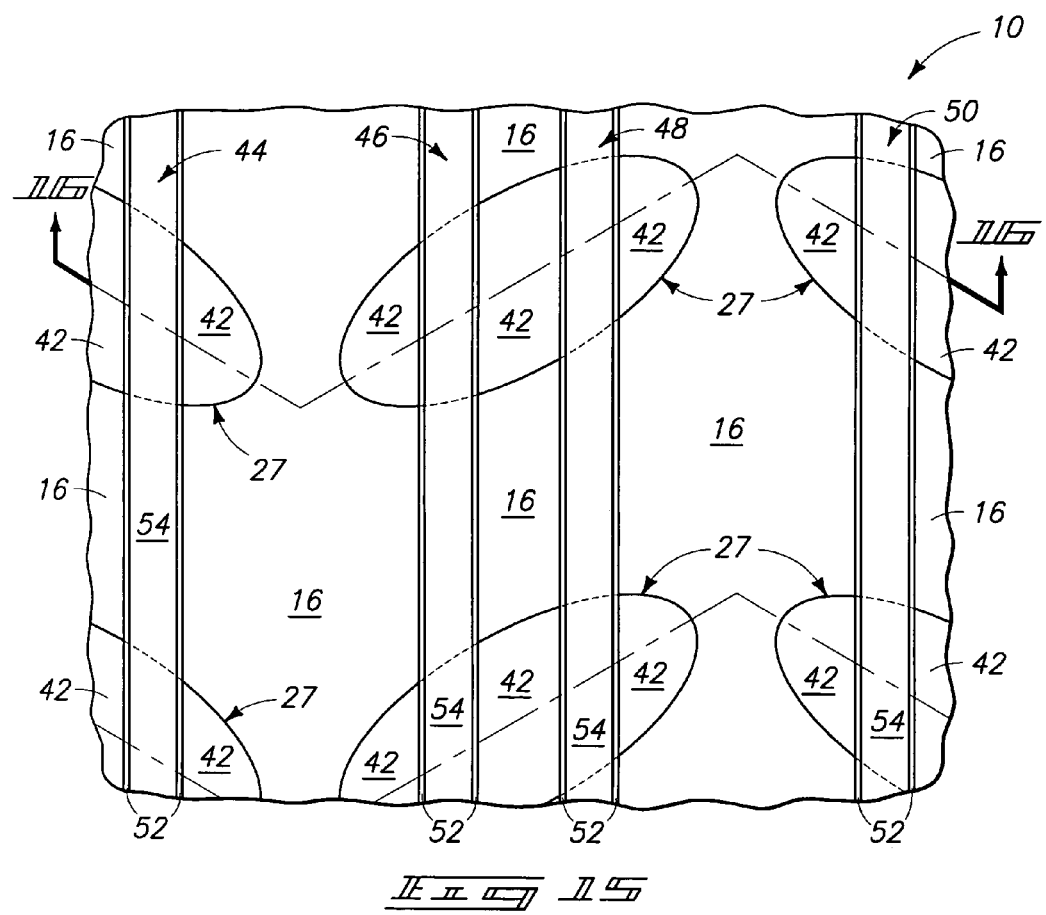
FIGS. 15 and 16 are views of the fragments of FIGS. 1 and 2, respectively, at a processing stage subsequent to that of FIGS. 13 and 14, in accordance with an exemplary aspect of the present invention. The cross-section of FIG. 16 is along the line 16-16 of FIG. 15.
Figure 16:
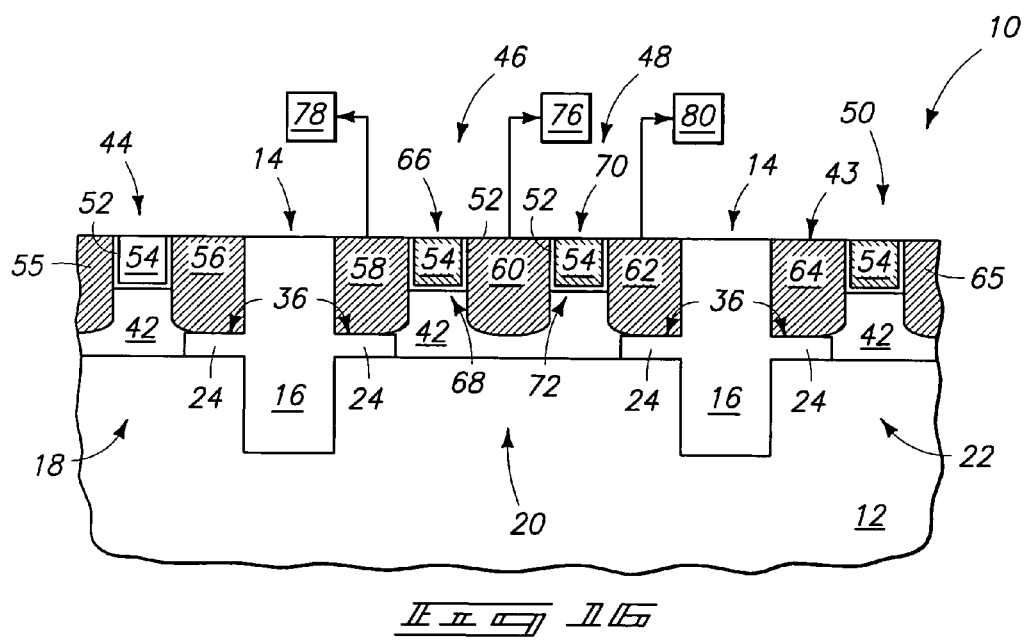

Referring next to FIGS. 15 and 16, wordlines 44, 46, 48 and 50 are formed to extend across the active area locations 27. In the shown aspect of the invention, the wordlines have portions recessed within semiconductor material 42. Specifically, trenches are formed within the semiconductor material 42 and lined with gate dielectric 52, and subsequently electrically conductive wordline material 54 is provided within the lined trenches. The gate dielectric can comprise any suitable composition or combination of compositions, and can, for example, comprise, consist essentially of, or consist of silicon dioxide. The conductive wordline material can comprise any suitable composition or combination of compositions, including, for example, various metals, metal-containing compounds, and/or conductively-doped semiconductor materials.

Conductively-doped source/drain regions 55, 56, 58, 60, 62, 64 and 65 are formed adjacent the wordlines in the active area locations. The wordlines can be considered to comprise transistor gates extending across the active area locations and gatedly connecting source/drain regions that are on opposing sides of the transistor gates. For instance, wordline 46 is shown in FIG. 16 to comprise a transistor gate 66 that gatedly connects source/drain region 58 with source/drain region 60. More specifically, the connection of source/drain regions 58 occurs through a channel region 68 that is within the semiconductor material 42 beneath the gate and between the source/drain regions (the channel region can be appropriately doped with a threshold voltage implant, as is known to persons of ordinary skill in the art).

FIG. 16 also shows wordline 48 comprising a transistor gate 70 that gatedly connects source/drain region 60 to source/drain region 62, with such connection occurring through a channel region 72 along the gate and between the source/drain regions.

Notably, some of the source/drain regions shown in FIG. 16 are primarily directly over segments 36 of dielectric material 24 (specifically, the source/drain regions 56, 58, 62 and 64), and the channel regions are not primarily directly over any segments of the dielectric material. The reference to a region as being "primarily directly over" a segment is utilized to indicate that the majority of the indicated region is directly over the segment, which includes, but is not limited to, constructions in which the entirety of the indicated region is directly over the segment. The reference to a region as being "not primarily directly over" a segment is utilized to indicate that the majority of the indicated region is not directly over the segment, which includes, but is not limited to, constructions in which none of the indicated region is directly over the segment.

In the shown aspect of the invention, the source/drain regions extend deep enough into material 42 to reach the segments 36 of dielectric material 24.

The source/drain regions that are primarily directly over segment 36 of dielectric material 24 have the advantages of SOI in that junctions of such source/drain regions are less prone to leakage than such junctions would be without the underlying segment of dielectric material. In contrast, the lack of dielectric material beneath the channel regions can allow a strong tie to occur between the channel regions and the substrate body corresponding to the bulk semiconductor material 12. Thus, the construction of FIGS. 15 and 16 can be understood to be partial SOI in that there is SOI associated with source/drain regions of transistor devices and not with channel regions of the devices.

In some aspects, the wordlines 46 and 48 can be considered to be paired wordlines extending across the same active areas 27 as one another. Transistors having gates formed by such paired wordlines can be incorporated into DRAM unit cells, and such cells can be incorporated into a DRAM array. For instance, the paired transistors over mesa 20 of FIG. 16 can be incorporated into a DRAM unit cell by electrically connecting a bitline 76 to the shared source/drain region 60, and electrically connecting charge storage devices 78 and 82 (typically capacitors) to the source/drain regions 58 and 62. The other source/drain regions 56 and 64 of FIG. 16 could similarly be connected to charge storage devices to incorporate such other source/drain regions into the DRAM array.

Although the transistor gates of FIG. 16 are shown recessed into the semiconductor material 42, it is to be understood that any suitable gate structure can be utilized in various aspects the invention, including, for example, non-recessed gates, such as planar gates extending across the planarized surface 43. An exemplary application utilizing planar gates is described with reference to FIGS. 17-19. Similar numbering will be utilized in describing FIGS. 17-19 as is used above.

Figure 19:
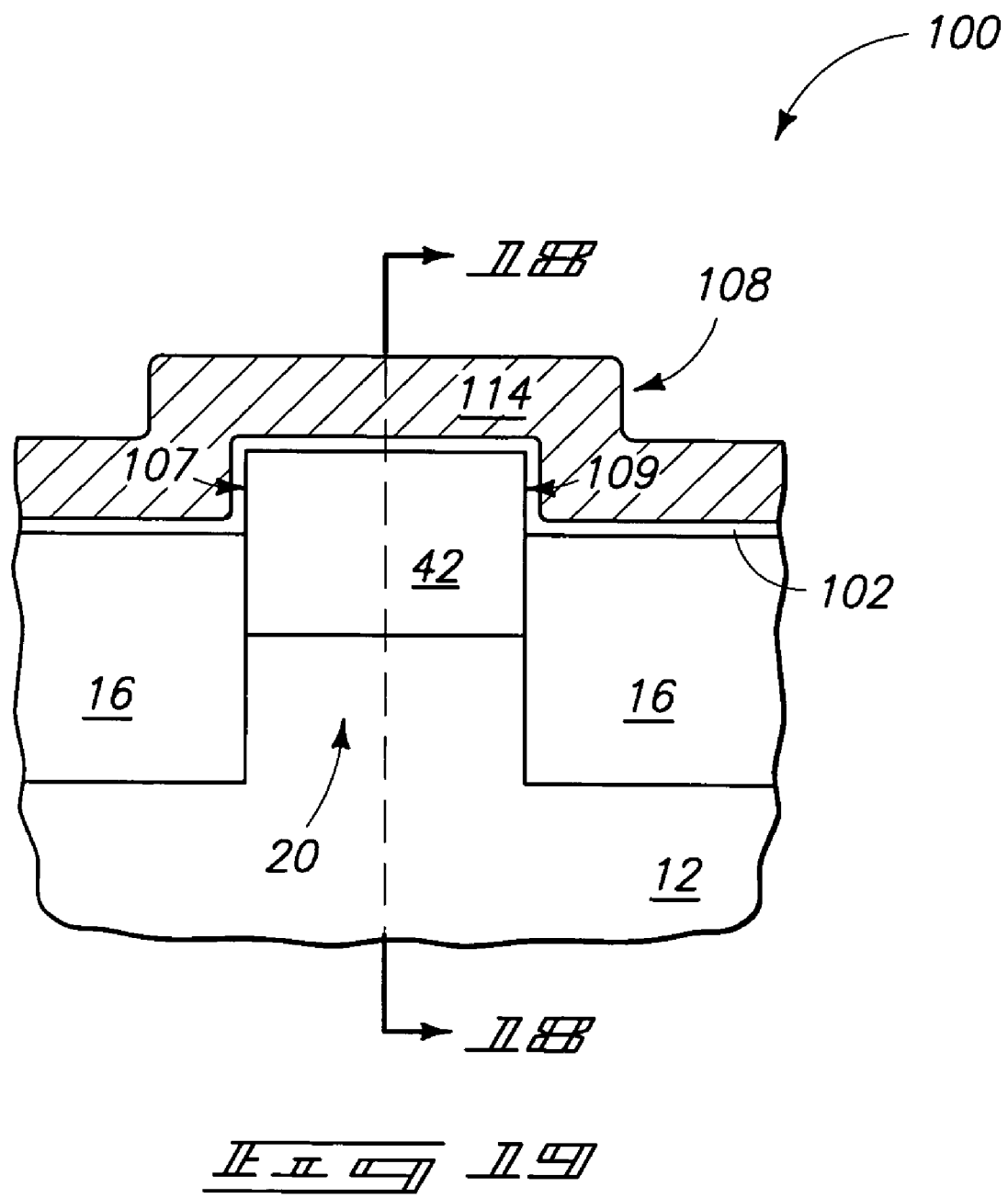
FIG. 19 is a cross-section along the line 19-19 of FIG. 17. The cross-section of FIG. 19 crosses that of FIG. 18, and accordingly the cross-section of FIG. 19 is along the line 19-19 of FIG. 18, and the cross-section of FIG. 18 is along the line 18-18 of FIG. 19.

FIGS. 17-19 show a construction 100 at a processing stage subsequent to that of FIGS. 13 and 14. The construction includes the first semiconductor material 12, second semiconductor material 42, and segments 36 of dielectric material 24 described previously. The segments 36 are spaced from one another by gaps 40 corresponding to sections of semiconductor material between the segments.

The construction also includes the isolation regions 14 containing insulative material 16. However, the insulative material 16 has been recessed relative to the planar upper surface 43 of semiconductor material 42, resulting in the active area locations 27 being elevated relative to the isolation regions.

One of the active area locations 27 is relabeled as 102 in FIGS. 17-19, and such active area location is shown in cross-sectional view in FIGS. 18 and 19. The active area location can be seen to comprise a region of the semiconductor material 42 having an upper surface 43 above uppermost surfaces of isolation regions 14, and having, in the shown across-sectional views, pairs of opposing sidewall edges (edges 103 and 105 in the view of FIG. 18, and edges 107 and 109 in the view of FIG. 19) extending from the upper surface 43 down to the uppermost surfaces of the isolation regions.

Gate dielectric 104 is formed over second conductive material 42, and subsequently electrically conductive wordlines 106, 108, 110 and 112 are formed across an uppermost surface of construction 100, and specifically across the recessed isolation regions and across the gate dielectric. The gate dielectric can comprise any suitable electrically insulative composition or combination of compositions, and in particular aspects can comprise, consist essentially of, or consist of silicon dioxide. Although the gate dielectric is shown covering an entirety of the surface of semiconductor material 42, it is to be understood that the invention also encompasses aspects in which the gate dielectric is only provided beneath the wordlines.

The wordlines are shown comprising electrically conductive material 114. Such can be any suitable electrically conductive composition or combination of compositions, including, for example, various metals, metal-containing compositions, and/or conductively-doped semiconductor material. Persons of ordinary skill in the art will recognize that the wordlines would typically have electrically insulative caps thereover, and electrically insulative sidewall spacers along the sidewall edges. The electrically insulative materials that would typically provided around the conductive lines are not shown to simplify the drawings, but it should be understood that such insulative materials can be included in various aspects of the invention.

The cross-section of FIG. 19 shows that the wordline material 114 and dielectric material 104 extend upwardly along the sidewall edges 107 and 109 of the elevated region of semiconductor material 42.

The wordlines 106, 108, 110 and 112 comprise transistor gates over the active areas, and FIG. 18 show gates 115, 117, 119 and 121 extending over semiconductor material 42. FIG. 18 also shows source/drain regions 111, 116, 118, 120, 122, 123 and 125 formed within the semiconductor material 42 proximate the transistor gates. Source/drain regions 118 and 120, together with the gate 117 form a first transistor 130, and source/drain regions 120 and 122, together with transistor gate 119 form a second transistor 132. The first transistor has a channel region 134 extending beneath gate 117 and between source/drain regions 118 and 120; and the second transistor has a channel region 136 beneath gate 119 and between source/drain regions 120 and 122. The first and second transistors 130 and 132 are similar to the transistors discussed above with reference to FIGS. 15 and 16 in that both transistors comprise partial SOI structures—with a source/drain region being primarily directly over an insulative segment 36, and a channel region not being primarily directly over an insulative segment.

Transistors 130 and 132 can be incorporated into a DRAM unit cell by electrically connecting shared source/drain region 120 to a bitline 138, and electrically connecting source/drain regions 118 and 122 to charge storage devices 140 and 142. In some aspects, source/drain region 118 can be considered a first source/drain region, source/drain region 122 can be considered a second source/drain region, and source/drain region 120 can be considered a third source/drain region. In such aspects, charge storage device 140 can be considered a first charge storage device electrically connected with the first source/drain region, and charge storage device 142 can be considered a second charge storage device electrically connected with the second source/drain region.

The aspects of the invention described with reference to FIGS. 1-19 form a shared source/drain region (such as the source/drain region 60 of FIG. 16, or the source/drain region 120 of FIG. 18) that is not primarily directly over a segment of dielectric material corresponding to partial SOI. The invention also includes aspects in which a shared source/drain region is formed over a segment of dielectric material corresponding to partial SOI, as discussed with reference to FIGS. 20-25. In referring to FIGS. 20-25, similar numbering will be used as is utilized above in describing FIGS. 1-19, where appropriate.

Figure 20:
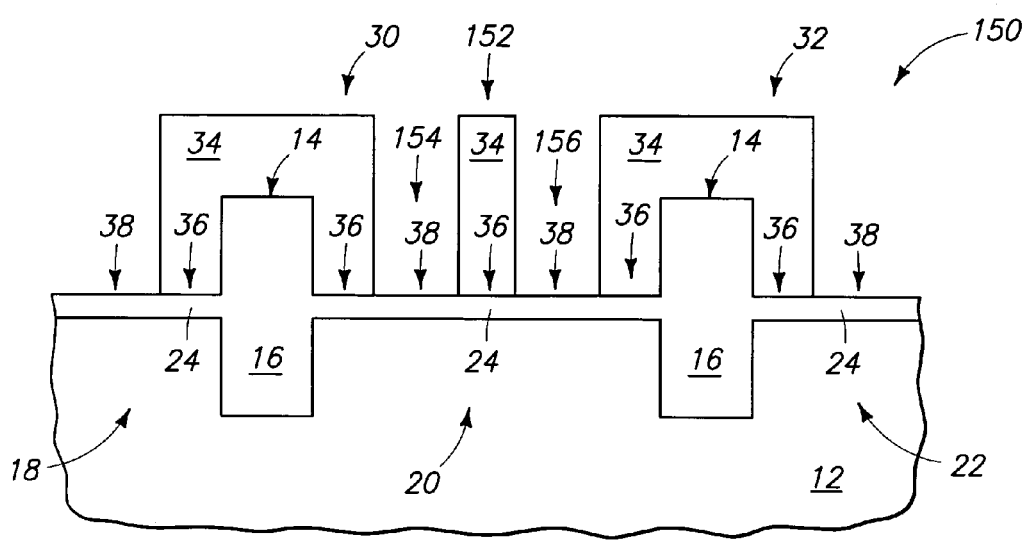
FIG. 20 is a view of the fragment of FIG. 2 shown at a processing stage subsequent to that of FIG. 4 in accordance with another aspect of the present invention.

Referring to FIG. 20, such shows a construction 150 at a processing stage subsequent to that of FIGS. 3 and 4. Construction 150 is similar to the construction 10 of FIGS. 5 and 6 in that construction 150 comprises bulk semiconductor material 12 having isolation regions 14 extending therein, and having dielectric material 24 thereover. The isolation regions comprise insulative material 16, and form a plurality of laterally surrounded portions or mesas 18, 20 and 22 of semiconductor material 12. The construction 150 of FIG. 20 also comprises the patterned protective blocks 30 and 32 of material 34. However, in contrast to the construction 10 of FIGS. 5 and 6, construction 150 of FIG. 20 comprises an additional patterned protective block 152 of material 34, with such block 152 being within a gap between blocks 30 and 32. The block 152 is spaced from blocks 30 and 32 by gaps 154 and 156, respectively. The blocks 30, 32 and 152 cover portions 36 of dielectric material 24, and the various gaps between and adjacent the patterned protective blocks expose portions 38 of the dielectric material.

Figure 21:
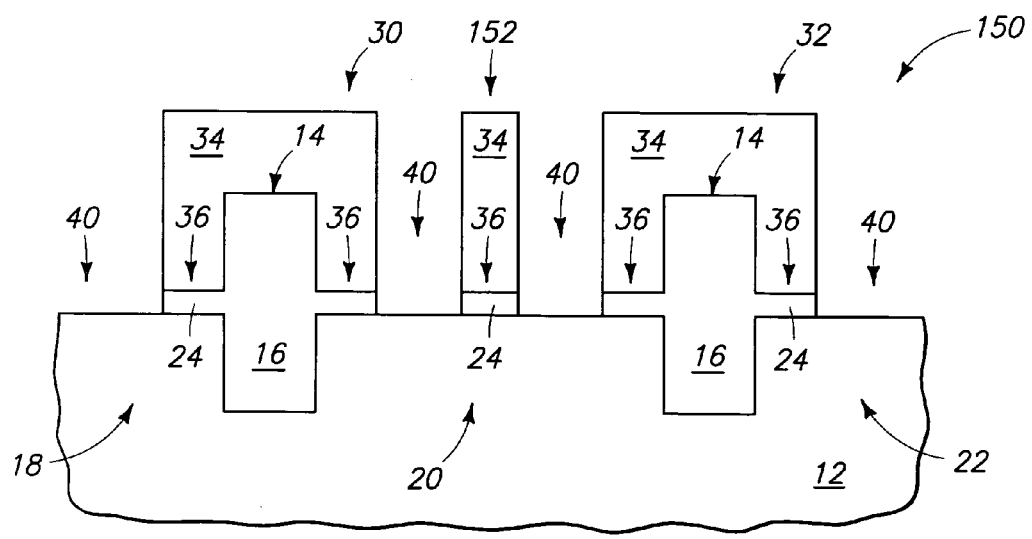
FIG. 21 is view of the fragment of FIG. 20 shown at a processing stage subsequent to that of FIG. 20.

Referring to FIG. 21, the exposed portions of the dielectric material 24 are removed to leave gaps 40 extending to semiconductor material 12, and between segments 36 of the remaining dielectric material 24. The processing utilized to remove the exposed portions of dielectric material 24 can be analogous to that discussed above with reference to FIGS. 7 and 8.

Figure 22:
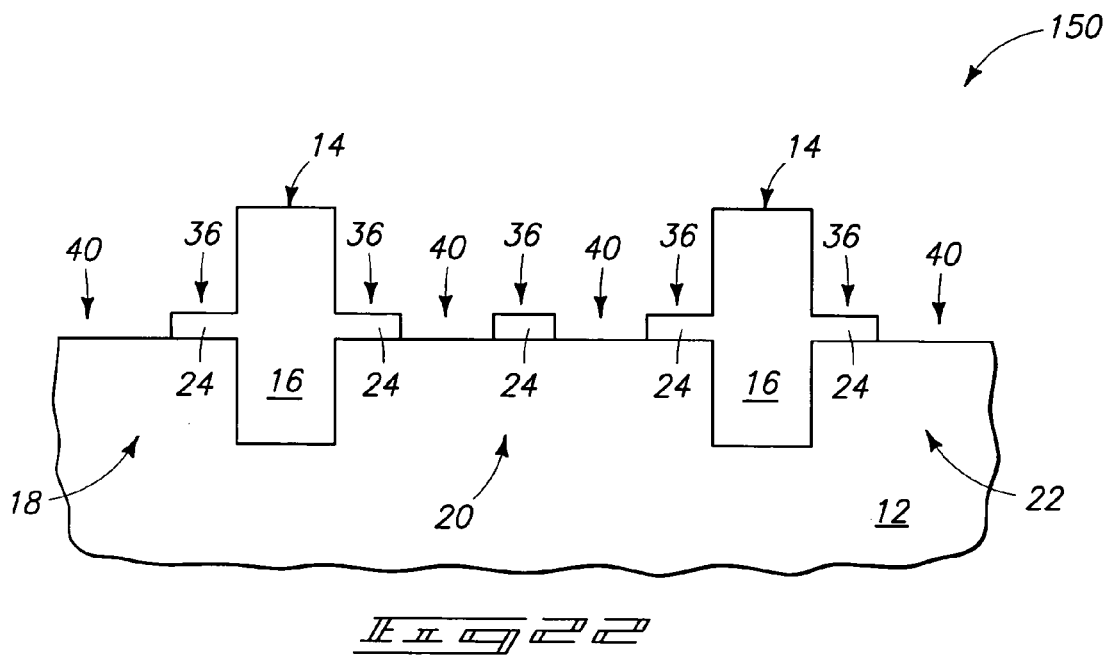
FIG. 22 is a view of the fragment of FIG. 20 shown at a processing stage subsequent to that of FIG. 21.

Referring to FIG. 22, the patterned protective blocks 30, 32 and 152 (FIG. 21) are removed with processing analogous to that discussed above with reference to FIGS. 9 and 10. The construction of FIG. 22 comprises three spaced segments 36 of dielectric material 24 over the mesa 20 of semiconductor material 12, and two gaps 40 extending between the spaced segments; in contrast to the embodiment of FIG. 10 which has two spaced segments 36 of the dielectric material over the mesa 20, and only one gap 40 over such mesa.

Figure 23:
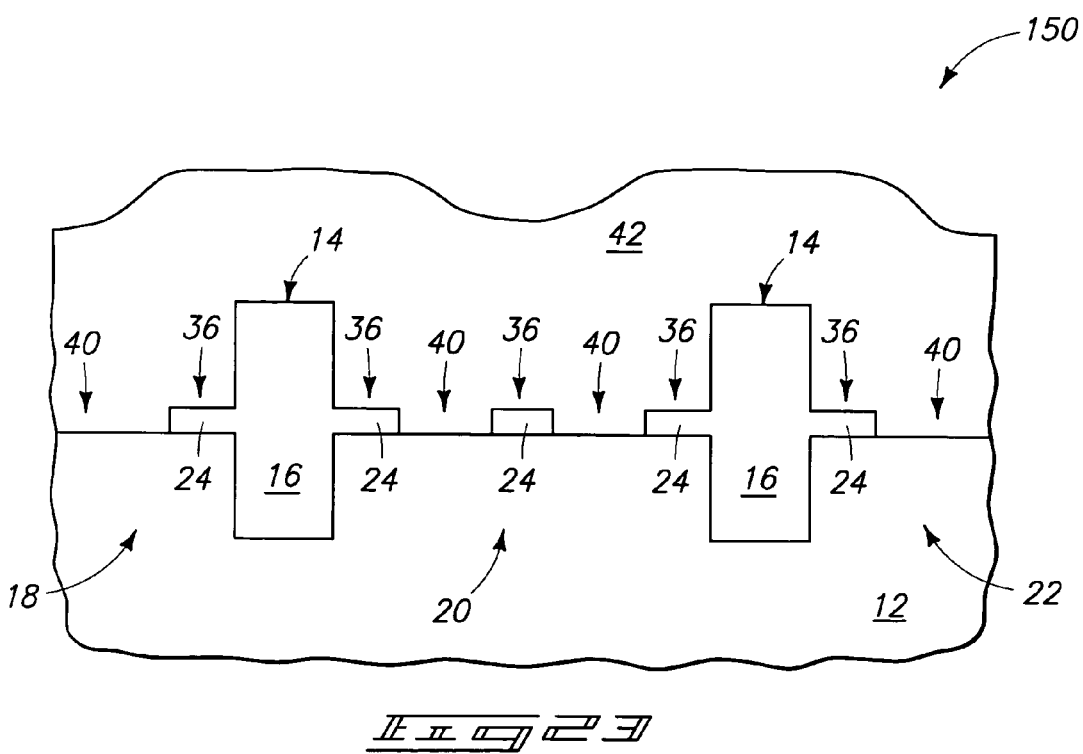
FIG. 23 is a view of the fragment of FIG. 20 shown at a processing stage subsequent to that of FIG. 22.

Referring to FIG. 23, second semiconductor material 42 is epitaxially grown over first semiconductor material 12 through gaps 40. Such second semiconductor material 42 is grown to a thickness sufficient to cover isolation regions 14 and segments 36. The second semiconductor material can be formed with processing analogous to that discussed above with reference to FIGS. 11 and 12.

Figure 24:
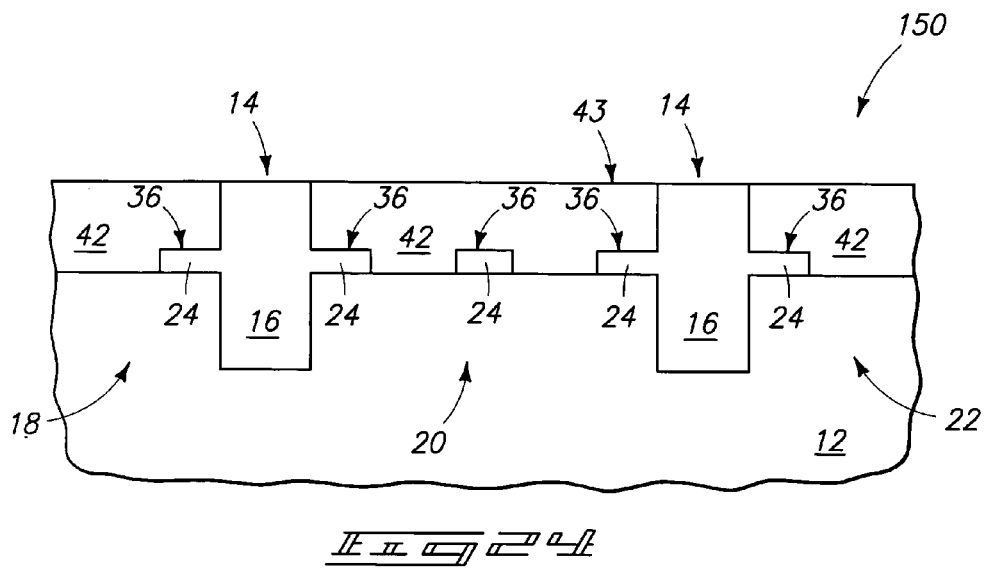
FIG. 24 is a view of the fragment of FIG. 20 shown at a processing stage subsequent to that of FIG. 23.

Referring to FIG. 24, construction 150 is subjected to planarization to form the planarized upper surface 43. Such planarization can be analogous to that discussed above with reference to FIGS. 13 and 14.

Figure 25:
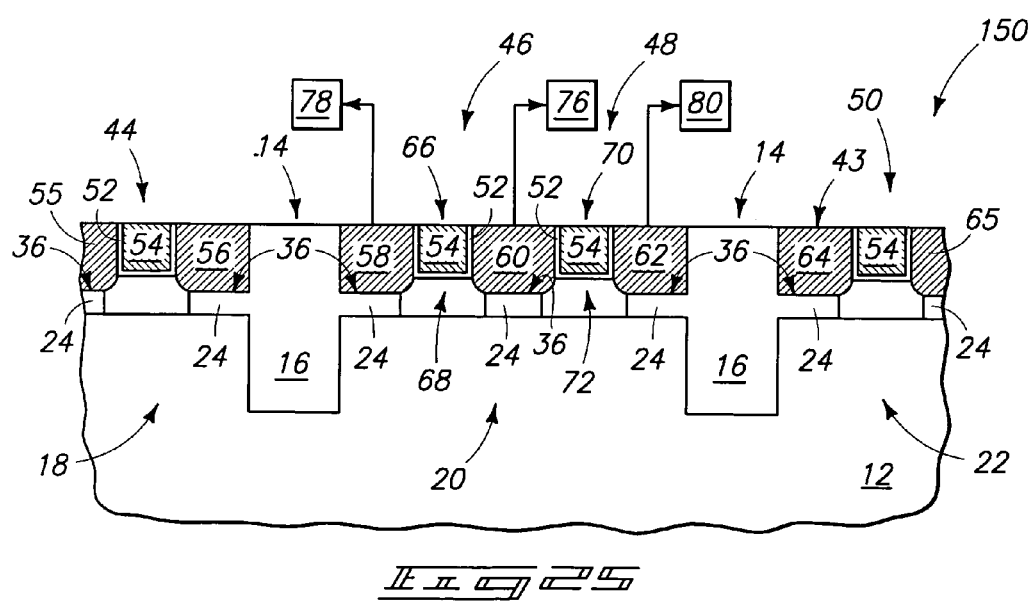
FIG. 25 is a view of the fragment of FIG. 20 shown at a processing stage subsequent to that of FIG. 24.

Referring to FIG. 25, trenches are formed within semiconductor material 42, lined with gate dielectric 52 and filled with conductive gate material 54 as described previously with reference to FIGS. 15 and 16. The conductive gate material is part of wordlines 46 and 48, and forms transistor gates 66 and 70 within the material 42, as discussed above with reference to FIGS. 15 and 16. Source/drain regions 58, 60 and 62 are formed adjacent gates 66 and 70, as discussed above with reference FIGS. 15 and 16. The source/drain regions of FIG. 25 are shown extending through the thickness of material 42 to uppermost surfaces of dielectric material 24. Source/drain regions 58 and 60 are gatedly connected by a channel region 68 extending along and beneath gate 66, and similarly source/drain regions 60 and 62 are gatedly connected by a channel region 72 extending along and beneath gate 70. FIG. 25 also shows source/drain regions 55, 56, 64 and 65 of the type described above with reference to FIGS. 15 and 16.

The source/drain regions 58 and 62 are electrically connected to charge storage devices (for instance, capacitors) 78 and 80, respectively, and the shared source/drain region 60 is electrically connected to a bitline 76. Such connections to charge storage devices and bitlines were discussed above with reference to FIG. 16.

Construction 150 of FIG. 25 differs from the construction 10 of FIG. 16 in that the shared source/drain region 60 of construction 150 is primary directly over a segment 36 of dielectric material 24. Thus, all of the source/drain regions 58, 60 and 62 of the paired transistors over mesa 20 are primarily directly over segments of dielectric material 24. Yet, channel regions 68 and 72 are advantageously not primarily directly over segments of dielectric of 24 in the partial SOI structure of FIG. 25.

Although the two transistors of FIG. 25 are shown having gates recessed into the semiconductor material 42, it is to be understood that other types of transistor devices can be utilized, including, for example, transistors of the type described above with reference to FIG. 18 which have planar transistor gates formed over a planarized top surface of semiconductor material 42. Also, it is to be understood that the concepts of FIGS. 17-19 can be combined with those of FIG. 25 to form constructions of the type shown in FIGS. 17-19 having the shared source/drain regions (for instance, region 120 of FIG. 18) primarily directly over segments of dielectric material 24.

Persons of ordinary skill in the art will recognize that the various aspects of the invention described herein can be utilized with any of numerous types of transistor constructions, including, for example, RAD, finFET and planar transistor constructions. The methodology of the present invention can be readily adapted to numerous fabrication schemes, including, for example, damascene-type schemes, and/or schemes in which oxide is recessed around partial-SOI pillars and then finFET transistors are formed (like, for example, the scheme described with reference to FIGS. 17-19).

Partial SOI constructions of the present invention can be incorporated into numerous electronic systems. For instance, the partial SOI constructions can be incorporated into memory arrays (such as, for example, DRAM arrays), which are subsequently utilized in computers or other electronic systems.

Figure 26:
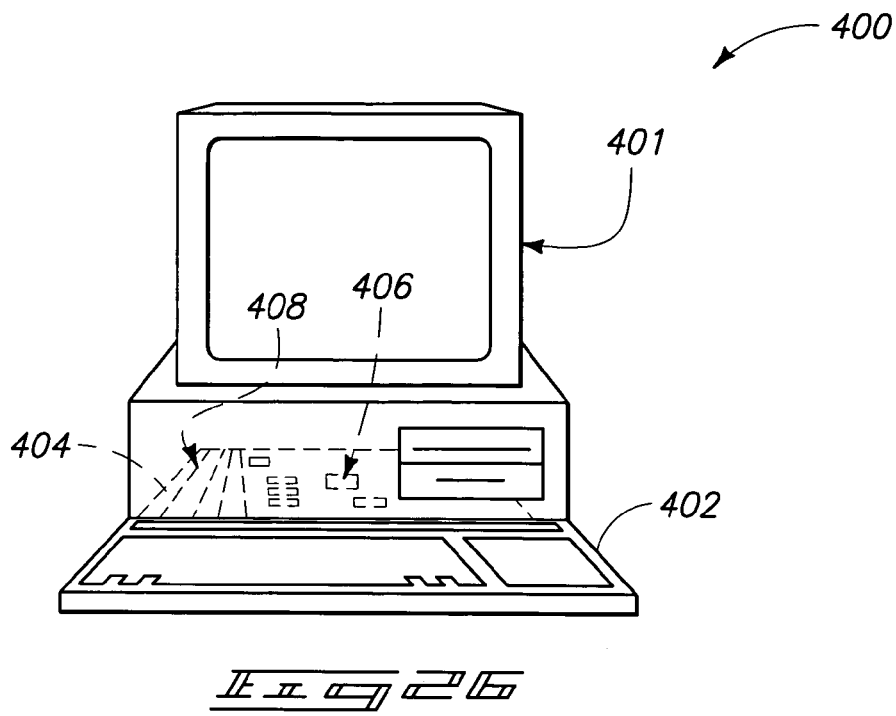
FIG. 26 is a diagrammatic view of a computer illustrating an exemplary application of the present invention.
Figure 27:
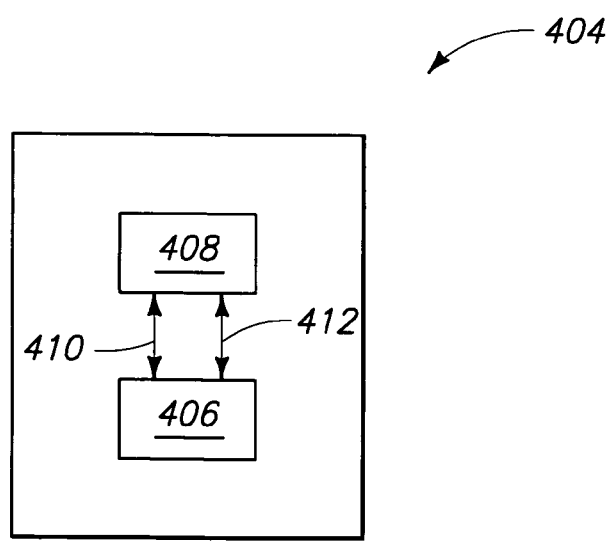
FIG. 27 is a block diagram showing particular features of the motherboard of the FIG. 26 computer.

FIG. 26 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 27. In such block diagram, the addressing circuitry is illustrated as 410 and the read circuitry is illustrated as 412. Various components of computer system 400, including processor 406, can comprise one or more of the partial SOI constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise partial SOI formed in accordance with one or more aspects of the present invention.

Figure 28:
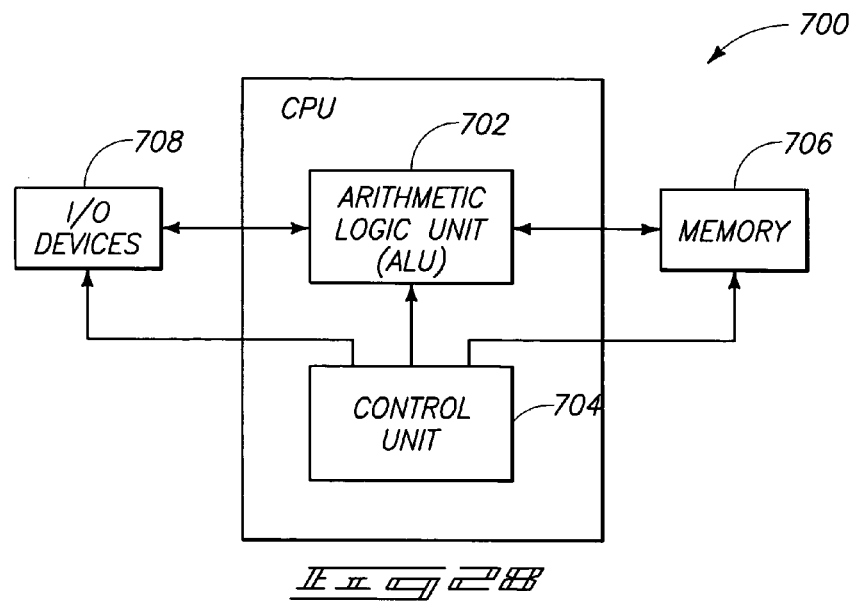
FIG. 28 is a high level block diagram of an electronic system according to an exemplary aspect of the present invention.

FIG. 28 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include partial SOI constructions in accordance with various aspects of the present invention.

Figure 29:
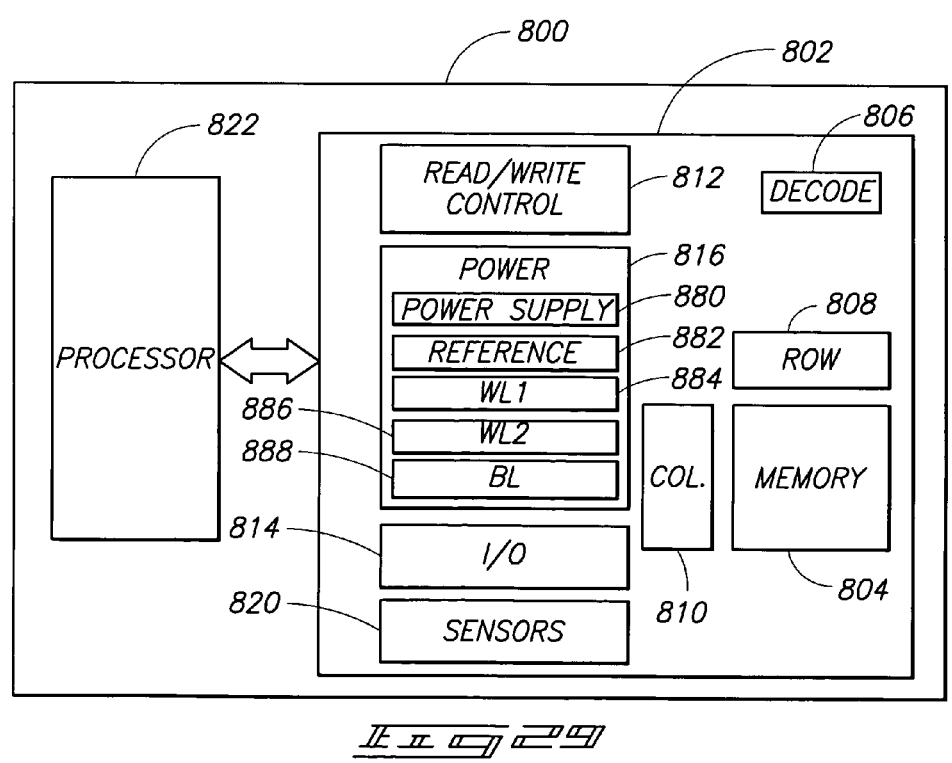
FIG. 29 is a simplified block diagram of an exemplary memory device according to an aspect of the present invention.

FIG. 29 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a partial SOI construction of a type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, comprising:
    providing a semiconductor substrate having a first semiconductor material, having an isolation region extending into the first semiconductor material, having a portion of the first semiconductor material laterally surrounded by the isolation region, and having a dielectric material over the portion;
    patterning the dielectric material into at least two segments separated by a gap;
    epitaxially growing a second semiconductor material through the gap and to over the segments of the dielectric material; and
    forming at least one transistor having a source/drain region within the second semiconductor material and that is primarily directly over one of the segments of the dielectric material, and having a channel region that is not primarily directly over any of the segments of the dielectric material.

2. The method of claim 1 wherein the source/drain region is formed to extend through the second semiconductor material to physically contact said one of the segments of the dielectric material.

3. The method of claim 1 wherein the patterning of the dielectric material forms three spaced segments of the dielectric material and two of the gaps; and wherein the forming the at least one transistor is forming two transistors; the two transistors sharing a source/drain region that is primarily directly over one of the segments of the dielectric material and having channel regions over the gaps.

4. The method of claim 3 wherein one of the transistors is a first transistor having a first source/drain region in addition to the shared source/drain region, the other of the transistors is a second transistor having a second source/drain region in addition to the shared source/drain region, and further comprising:
    forming a bitline in electrical connection with the shared source/drain region;
    forming a first capacitor in electrical connection with the first source/drain region; and
    forming a second capacitor in electrical connection with the second source/drain region.

5. The method of claim 3 wherein the two transistors have gates recessed into the second semiconductor material.

6. The method of claim 3 wherein the two transistors have planar gates that are not recessed into the second semiconductor material.

7. The method of claim 1 wherein the first and second semiconductor materials both comprise silicon.

8. The method of claim 1 wherein the first semiconductor material comprises monocrystalline silicon.

9. The method of claim 8 wherein the second semiconductor material comprises monocrystalline silicon.

10. The method of claim 1 wherein the dielectric material consists essentially of silicon dioxide.

11. The method of claim 10 wherein the isolation region comprises silicon dioxide extending into trenches in the first semiconductor material, and wherein the dielectric material joins with the silicon dioxide of the isolation region.

12. A method of forming a semiconductor construction, comprising:
    providing a semiconductor substrate having mesas of first semiconductor material laterally surrounded by isolation regions, and having dielectric material over the mesas;
    forming patterned protective blocks over portions of the dielectric material, at least some of the protective blocks extending across portions of two separate mesas;
    transferring a pattern from the patterned protective blocks to the dielectric material to pattern the dielectric material into spaced segments over the mesas, and to form gaps over the mesas and between the spaced segments;
    epitaxially growing second semiconductor material through the gaps and to over the segments of dielectric material; and
    forming transistors having source/drain regions within the second semiconductor material and primarily directly over the segments of the dielectric material, and having channel regions that are not primarily directly over any of the segments of the dielectric material.

13. The method of claim 12 wherein the first semiconductor material comprises monocrystalline silicon.

14. The method of claim 12 wherein the second semiconductor material comprises monocrystalline silicon.

15. The method of claim 12 wherein the patterned protective blocks comprise photoresist.

16. The method of claim 12 wherein the patterning of the dielectric material forms three spaced segments of the dielectric material over at least some of the mesas, and forms two of the gaps over said at least some of the mesas; and wherein the forming the transistors comprises forming pairs of the transistors over said at least some of the mesas; the pairs of transistors sharing a source/drain region that is primarily directly over one of the segments of the dielectric material, and having channel regions over the gaps.

17. The method of claim 16 wherein the pairs of transistors have other source/drain regions in addition to the shared source/drain regions; and further comprising forming bitlines electrically connected with the shared source/drain regions, and forming capacitors electrically connected with said others of the source/drain regions.

18. The method of claim 12 wherein:
the forming the transistors comprises formation of transistor gates;
the isolation regions comprise insulative material within trenches in the first semiconductor material;
the insulative material extends to above the dielectric material;
the second semiconductor material is epitaxially grown to over the insulative material as it is epitaxially grown through the gaps and to over the segments of dielectric material; and
prior to formation of the transistor gates, the second semiconductor material is subjected to planarization to form a planarized upper surface extending across the second semiconductor material and across the insulative material of the isolation regions.

19. The method of claim 18 wherein the transistor gates are recessed into the second semiconductor material.

20. The method of claim 18 wherein the transistor gates are planar and not recessed into the second semiconductor material.

21. The method of claim 12 wherein:
the forming the transistors comprises formation of transistor gates;
the isolation regions comprise insulative material within trenches in the first semiconductor material;
the insulative material extends to above the dielectric material;
the second semiconductor material is epitaxially grown to over the insulative material as it is epitaxially grown through the gaps and to over the segments of dielectric material;
the second semiconductor material is subjected to planarization to form a planarized upper surface extending across the second semiconductor material and across the insulative material of the isolation regions; and
prior to formation of the transistor gates, the insulative material of the isolation regions is recessed to beneath the planarized upper surface of the second semiconductor material.

22. The method of claim 21 wherein the insulative material comprises silicon dioxide, and wherein the first and second semiconductor materials comprise silicon.

23. A method of forming a semiconductor construction, comprising:
providing a semiconductor substrate having a bulk semiconductor material, having an isolation region extending into the bulk semiconductor material, having a mesa of the bulk semiconductor material laterally surrounded by the isolation region, and having a mask over the mesa; the mask comprising silicon nitride over dielectric material;
removing the silicon nitride of the mask, and forming protective blocking material that extends across at least some of the isolation region and partially across the mesa, the protective blocking material covering portions of the dielectric material of the mask and leaving at least one portion of the dielectric material exposed;
removing the at least one exposed portion of the dielectric material to expose semiconductor material of the mesa;
removing the blocking material to leave segments of the dielectric material over portions of the mesa adjacent the exposed semiconductor material of the mesa;
epitaxially growing a layer of semiconductor material from the exposed semiconductor material of the mesa, the epitaxially grown semiconductor material extending over the segments of dielectric material; and
forming at least one transistor structure having a source/drain region within the layer of semiconductor material and primarily directly over a segment of the dielectric material, and having a channel region that is not primarily directly over any of the segments of the dielectric material.

24. The method of claim 23 wherein the protective blocking material comprises photoresist.

25. The method of claim 23 wherein:
the isolation region comprises insulative material within a trench in the bulk semiconductor material;
the insulative material extends to above the bulk semiconductor material to a first height;
the silicon nitride of the mask extends to above the bulk semiconductor material to a second height; and
prior to the removing of the silicon nitride of the mask, the insulative material and silicon nitride are subjected to planarization to form a planarized upper surface extending across the silicon nitride and insulative material at a third height above the bulk semiconductor material, with the third height being below the first and second heights.

26. The method of claim 23 wherein the dielectric material consists essentially of silicon dioxide.

27. The method of claim 23 wherein the bulk semiconductor material comprises monocrystalline silicon.

28. The method of claim 27 wherein the layer of semiconductor material comprises monocrystalline silicon.

29. The method of claim 23 wherein the protective blocking material comprises photoresist.

30. The method of claim 23 further comprising forming some of the protective blocking material over a portion of the dielectric material across a central region of the mesa; wherein three spaced segments of the dielectric material remain over the mesa after the removing of the protective blocking material; and wherein the forming the transistor comprises forming a pair of the transistors over the mesa; the pair of transistors sharing a source/drain region that is primarily directly over one of the segments of the dielectric material.

31. The method of claim 30 wherein the pairs of transistors have other source/drain regions in addition to the shared source/drain region; and further comprising forming a bitline electrically connected with the shared source/drain region, and forming capacitors electrically connected with said others of the source/drain regions.

32. A semiconductor construction, comprising:
semiconductor material;
an isolation region extending into the semiconductor material and laterally surrounding a region of the semiconductor material, the region of the semiconductor material having an upper surface above the isolation region and having, in cross-sectional view, a pair of opposing sidewall edges extending from the upper surface to down along the isolation region;

a pair of spaced segments of dielectric material extending into the region of semiconductor material from laterally opposing sides of region, the segments being spaced from one another by at least one section of the semiconductor material;

a wordline extending across the isolation region and across the region of semiconductor material, the wordline extending upwardly along the opposing sidewall edges of the region of semiconductor material;

a gate dielectric between the wordline and the region of semiconductor material, the gate dielectric extending over the upper surface and along the opposing sidewall edges of the region of semiconductor material;

a transistor gate formed by the wordline over the region of the semiconductor material;

a first source/drain region on one side of the transistor gate and within the region of the semiconductor material primarily directly over one of the segments of the dielectric material;

a second source/drain region within the region of semiconductor material and on an opposing side of the transistor gate from the first source/drain region; and a transistor channel region along the transistor gate, between the first and second source/drain regions, and not primarily directly over any segment of the dielectric material.

33. The construction of claim 32 wherein the dielectric material consists essentially of silicon dioxide.

34. The construction of claim 32 further comprising:

a bitline electrically connected to the second source/drain region;

a first charge storage device electrically connected to the first source/drain region; and and a second charge storage device electrically connected to the third source/drain region.

35. The construction of claim 34 incorporated into an electronic system.

36. The construction of claim 32 comprising:

a third spaced segment of the dielectric material between said pair of spaced segments of the dielectric material;

a pair of said sections of the semiconductor material, a first of the pair of sections being between one of said pair of spaced segments and the third segment, and a second of the sections being between the other of said pair of spaced segments and the third segment;

a pair of the wordlines extending across the isolation region and across the region of the semiconductor material;

a pair of transistor gates formed by the wordlines over the region of the semiconductor material; one of the transistor gates being a first transistor gate and the other being a second transistor gate; the first transistor gate being the transistor gate between the first and second source/drain regions; the second source/drain region being between the first and second transistor gates and primarily directly over the third spaced segment;

a third source/drain region within the region of the semiconductor material and on an opposing side of the second transistor gate from the second source/drain region; and a transistor channel region along the second transistor gate, between the second and third source/drain regions, and not primarily directly over any segment of the dielectric material.

37. The construction of claim 36 further comprising:

a bitline electrically connected to the second source/drain region;

a first charge storage device electrically connected to the first source/drain region; and and a second charge storage device electrically connected to the third source/drain region.

38. The construction of claim 37 incorporated into an electronic system.

39. The construction of claim 37 wherein the dielectric material consists essentially of silicon dioxide.

* * * * *

UNITED STATES PATENT AND TRADEMARK OFFICE
CERTIFICATE OF CORRECTION

| | |
|---|---|
| PATENT NO. | : 7,378,704 B2 |
| APPLICATION NO. | : 11/377094 |
| DATED | : May 27, 2008 |
| INVENTOR(S) | : Parekh |

It is certified that error appears in the above-identified patent and that said Letters Patent is hereby corrected as shown below:

In column 17, line 34, in Claim 34, before "a" delete "and".

In column 18, line 32, in Claim 37, before "a" delete "and".

Signed and Sealed this

Nineteenth Day of August, 2008

JON W. DUDAS
*Director of the United States Patent and Trademark Office*